(12) United States Patent
Lim et al.

(10) Patent No.: US 12,575,292 B2
(45) Date of Patent: Mar. 10, 2026

(54) DISPLAY DEVICE THAT REDUCES INFLITRATION OF MOISTURE AND METHOD OF MANUFACTURING THE SAME

(71) Applicant: Samsung Display Co., LTD., Yongin-si (KR)

(72) Inventors: Tae Woo Lim, Cheonan-si (KR); Moonsoon Kim, Asan-si (KR); Jae-Seung Kim, Hwaseong-si (KR); Seunghui Seo, Pyeongtaek-si (KR); Moon-Keun Choi, Hwaseong-si (KR); Sangbeom Han, Hwaseong-si (KR); Kipyo Hong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 462 days.

(21) Appl. No.: 17/984,698

(22) Filed: Nov. 10, 2022

(65) Prior Publication Data

US 2023/0144317 A1     May 11, 2023

(30) Foreign Application Priority Data

Nov. 10, 2021     (KR) ........................ 10-2021-0154326

(51) Int. Cl.
| | |
|---|---|
| *H10K 59/38* | (2023.01) |
| *H10K 59/12* | (2023.01) |
| *H10K 59/80* | (2023.01) |
| *H10K 71/00* | (2023.01) |

(52) U.S. Cl.
CPC .......... *H10K 59/38* (2023.02); *H10K 59/871* (2023.02); *H10K 59/879* (2023.02); *H10K 71/00* (2023.02); *H10K 59/12* (2023.02); *H10K 59/1201* (2023.02)

(58) Field of Classification Search
None
See application file for complete search history.

(56) References Cited

U.S. PATENT DOCUMENTS

| | | | |
|---|---|---|---|
| 2015/0123092 A1* | 5/2015 | Kikuchi ............... | H10K 59/871 |
| | | | 257/40 |
| 2020/0004074 A1* | 1/2020 | Nagasawa ............. | G02F 1/1339 |
| 2024/0122022 A1* | 4/2024 | Yagi ....................... | H10K 59/38 |

FOREIGN PATENT DOCUMENTS

| | | |
|---|---|---|
| CN | 104865741 | 10/2018 |
| EP | 3620848 | 6/2021 |

* cited by examiner

*Primary Examiner* — Nduka E Ojeh
(74) *Attorney, Agent, or Firm* — CANTOR COLBURN LLP

(57) ABSTRACT

Provided is a display device including: a first substrate including a display area, and a non-display area surrounding the display area; a second substrate disposed on the first substrate, and facing the first substrate; a first color filter disposed between the first substrate and the second substrate, and including a first opening exposing the second substrate in the non-display area; and a refractive layer disposed between the first substrate and the first color filter to overlap the display area and the non-display area and to fill the first opening in the non-display area.

22 Claims, 32 Drawing Sheets

F I G .  11
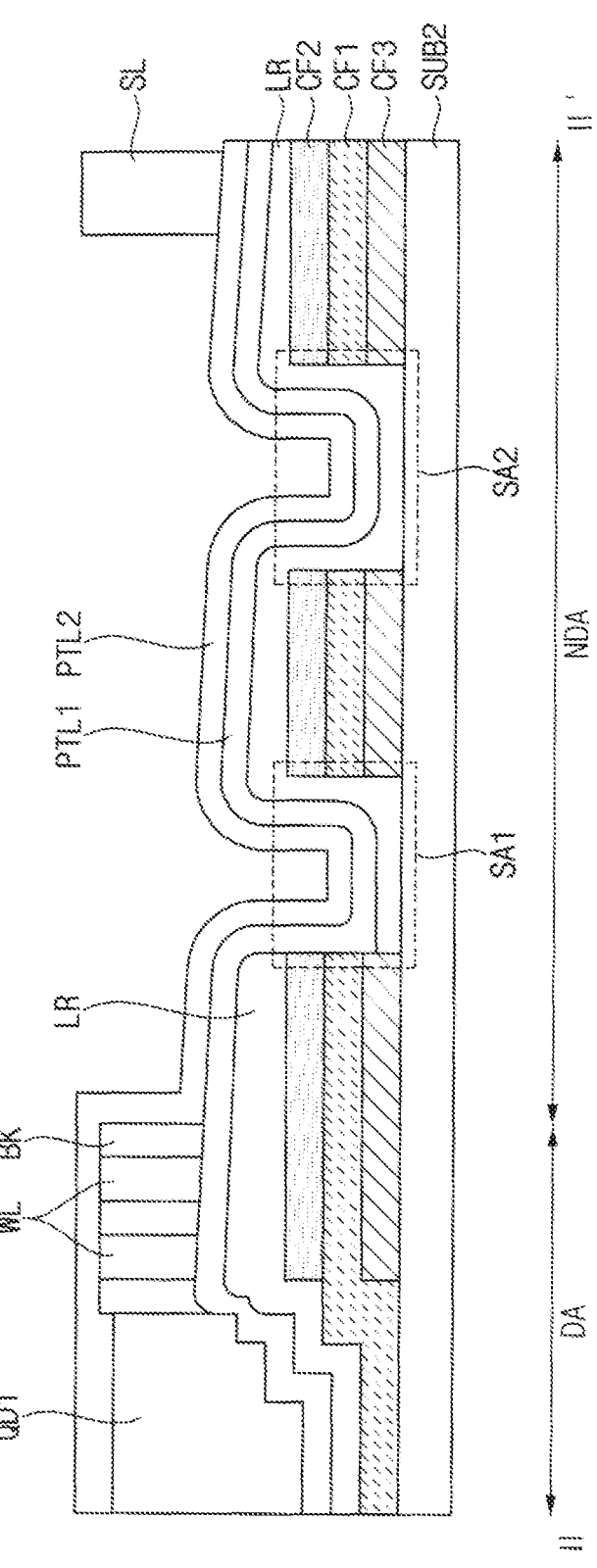

F I G.  12
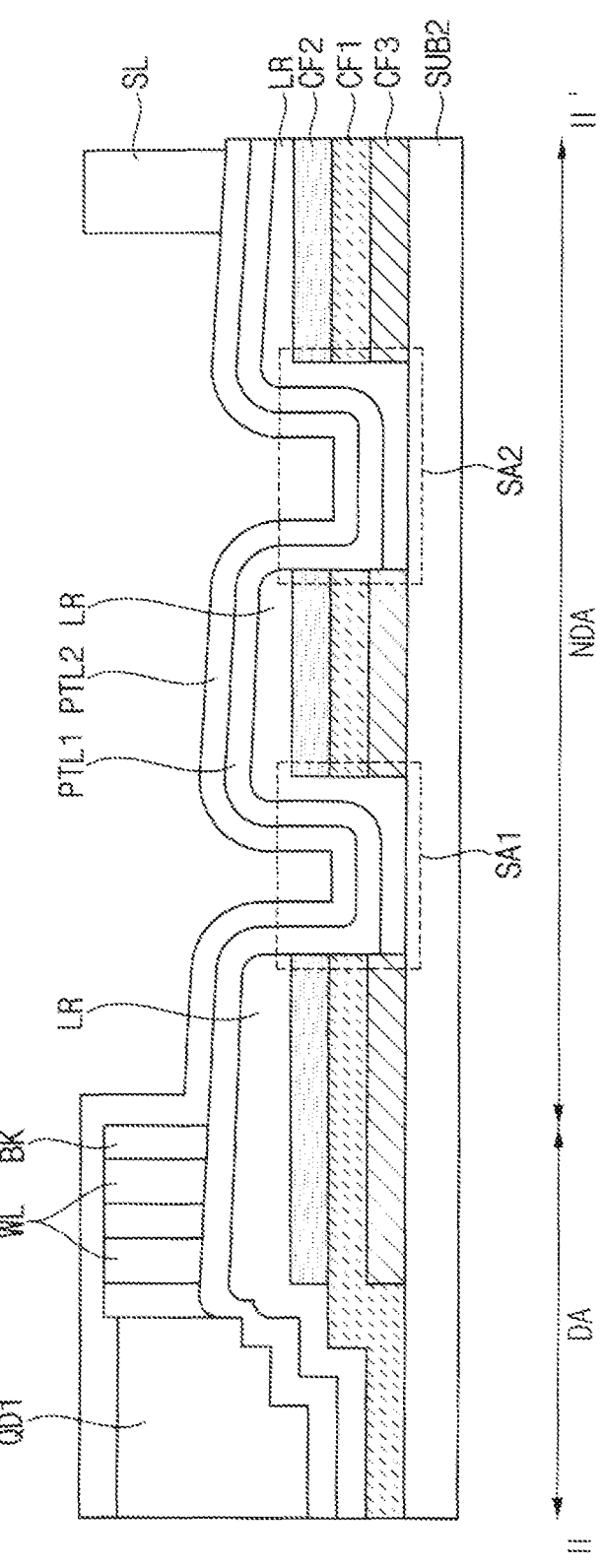

1

DISPLAY DEVICE THAT REDUCES INFLITRATION OF MOISTURE AND METHOD OF MANUFACTURING THE SAME

CROSS-REFERENCE TO RELATED APPLICATION(S)

This application claims priority to and benefits of Korean Patent Application No. 10-2021-0154326 under 35 USC § 119, filed on Nov. 10, 2021 in the Korean Intellectual Property Office (KIPO), the entire contents of which are incorporated herein by reference.

BACKGROUND

1. Technical Field

This disclosure relates to a display device capable of displaying a high-quality image, and a method of manufacturing such a display device.

2. Description of the Related Art

A display device may include a driving element and a light emitting element to emit a light. The driving element may include a transistor, a capacitor, and the like. The light emitting element may include an organic light emitting element, an inorganic light emitting element, and the like. The light emitting element may be connected to the driving element to receive a signal.

In case that moisture penetrates into the display device, performance of the light emitting element and the driving element may be deteriorated by the moisture. Therefore, various schemes for preventing moisture from penetrating into a display device have been researched.

For example, an encapsulation layer may be disposed on an upper portion of a light emitting element. Due to the encapsulation layer having a structure in which an inorganic layer and an organic layer may be stacked on each other, moisture penetrating from a top surface of the display device may not reach the light emitting element.

Various schemes for preventing moisture penetrating from a side surface of a display device from reaching a light emitting element and a driving element have been researched.

SUMMARY

An aspect of the disclosure is to provide a display device capable of displaying an image.

Another aspect of the disclosure is to provide a method of manufacturing a display device, capable of displaying an image.

A display device may include a first substrate including a display area, and a non-display area adjacent to the display area, a second substrate disposed on the first substrate, and facing the first substrate, a first color filter disposed between the first substrate and the second substrate, and including a first opening exposing the second substrate in the non-display area and a refractive layer disposed between the first substrate and the first color filter overlapping the display area and the non-display area in a plan view, and filling the first opening in the non-display area.

In an embodiment, the display device may further include a second color filter disposed between the first color filter and the refractive layer, and exposing the second substrate in an area overlapping the first opening in a plan view.

In an embodiment, the second color filter may expose the first color filter in an area adjacent to the first opening.

In an embodiment, the display device may further include a third color filter disposed between the second color filter and the refractive layer, and exposing the second substrate in an area overlapping the first opening in a plan view.

In an embodiment, a thickness of the refractive layer overlapping the first color filter in the non-display area in a plan view decreases farther from the display area.

In an embodiment, the third color filter may expose the second color filter in an area adjacent to the first opening.

In an embodiment, a thickness of the refractive layer overlapping the first color filter in the non-display area in a plan view decreases farther from the display area.

In an embodiment, the display device may further include a light blocking member disposed on the refractive layer and filling the first opening.

In an embodiment, the refractive layer may be cut at the first opening.

In an embodiment, the first color filter may include a second opening exposing the second substrate in the non-display area.

In an embodiment, the display device may further include a second color filter disposed between the first color filter and the refractive layer, and exposing the second substrate in an area overlapping the first opening in a plan view and an area overlapping the second opening in a plan view.

In an embodiment, the second color filter may expose the first color filter in an area adjacent to the first opening and an area adjacent to the second opening.

In an embodiment, the display device may further include a third color filter disposed between the second color filter and the refractive layer, and exposing the second substrate in an area overlapping the first opening in a plan view and an area overlapping the second opening in a plan view.

In an embodiment, the third color filter may expose the second color filter in an area adjacent to the first opening and an area adjacent to the second opening.

In an embodiment, the display device may further include a first light blocking member disposed on the refractive layer and filling the first opening, and a second light blocking member disposed on the refractive layer and filling the second opening.

In an embodiment, the display device may further include a driving element disposed on the first substrate between the first substrate and the refractive layer, and a light emitting element disposed on the driving element between the driving element and the refractive layer.

A method of manufacturing a display device may include forming an element substrate by forming a driving element and a light emitting element on a first substrate, the first substrate including a first display area and a first non-display area adjacent to the first display area, forming color filters on a second substrate including a second display area corresponding to the first display area, a second non-display area corresponding to the first non-display area and adjacent to the second display area, and a cutting area extending from the second non-display area, forming a first opening in the color filters to expose the second substrate in the second non-display area, forming a second opening in the color filters to expose the second substrate in the cutting area such that the second opening may be spaced apart from the first opening, forming a refractive layer on the color filters to fill the first opening and the second opening, attaching the second substrate to the element substrate such that the refractive layer faces the driving element and the light emitting element and cutting a portion between the first opening and the second opening.

In an embodiment, the method may further include forming a light blocking member on the refractive layer to fill the first opening, before the cutting of the portion between the first opening and the second opening.

In an embodiment, the forming of the refractive layer on the color filters to fill the first opening and the second opening may include applying a refractive material for forming the refractive layer onto the color filters that may be adjacent to the first opening, applying the refractive material for forming the refractive layer onto the color filters that may be adjacent to the second opening and allowing the refractive material applied onto the color filters to flow into the first opening and the second opening by steps formed by the first opening and the second opening.

In an embodiment, a thickness of the refractive layer in the second non-display area decreases farther from the second display area in an area in which the color filters and the refractive layer overlap each other in a plan view.

In an embodiment, the color filters may form a step in an area adjacent to the first opening.

In an embodiment, the color filters may form a step in an area adjacent to the second opening.

In an embodiment, the method may further include forming a sealing member on the refractive layer formed between the first opening and the second opening, before the cutting of the portion between the first opening and the second opening.

In the method of manufacturing the display device, an opening may be formed in a color filter disposed in a non-display area. Accordingly, the thickness of the refractive layer formed in the non-display area may decrease toward the outside of the non-display area, and the area, which may be readily permeated by moisture, where the refractive layer is exposed to moisture may be reduced.

Accordingly, the display device manufactured by the method of manufacturing the display device can effectively prevent moisture from penetrating and display a high-quality image.

However, aspects of the disclosure are not limited to the above-described aspects, and may be variously expanded without departing from the idea and scope of the disclosure.

BRIEF DESCRIPTION OF THE DRAWINGS

FIGS. 2A and 2B are schematic sectional views taken along line I-I' of the display device of FIG. 1 according to an embodiment.

FIG. 11 is a schematic sectional view taken along line II-II' of the display device of FIG. 1 according to still another embodiment.

FIG. 12 is a schematic sectional view taken along line II-II' of the display device of FIG. 1 according to yet another embodiment.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
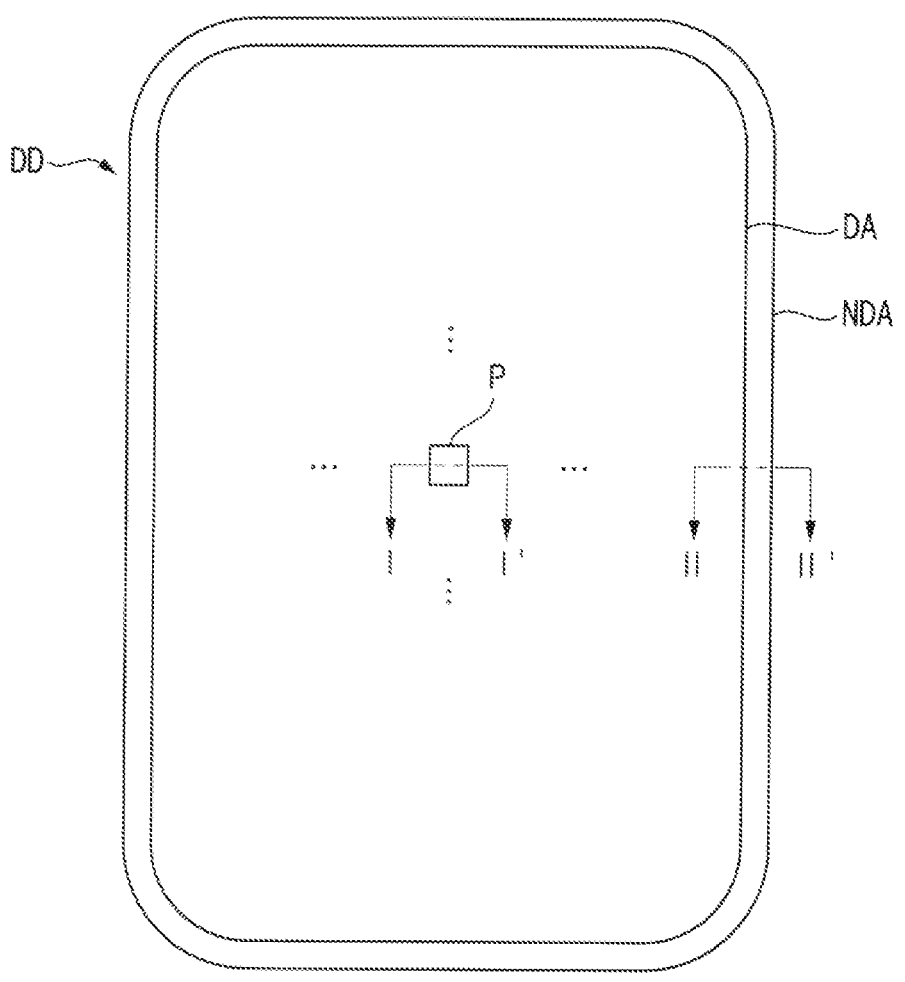
FIG. 1 is a schematic plan view showing a display device according to an embodiment.

FIG. 1 is a schematic plan view showing a display device according to an embodiment.

Referring to FIG. 1, a display device DD may include a display area DA and a non-display area NDA. The display device DD may display an image in the display area DA. To this end, pixels P may be disposed in the display area DA. The pixels P may be disposed over the whole display area DA. For example, the pixels P may be disposed over the whole display area DA in a matrix form. Each of the pixels P may include a driving element and a light emitting element. The light emitting element may be connected to the driving element to receive a signal from the driving element. The light emitting element may emit a light based on the signal. The driving element may include a transistor, a capacitor, and the like. The light emitting element may be an organic light emitting element or an inorganic light emitting element.

The display device DD may include drivers. The drivers may include a gate driver, a data driver, an emission signal generator, a power supply voltage generator, and the like. The drivers may be disposed in the non-display area NDA. The drivers may be electrically connected to the pixels P. The drivers may transmit signals to the pixels P so that the pixels P may emit lights.

Figure 2A:
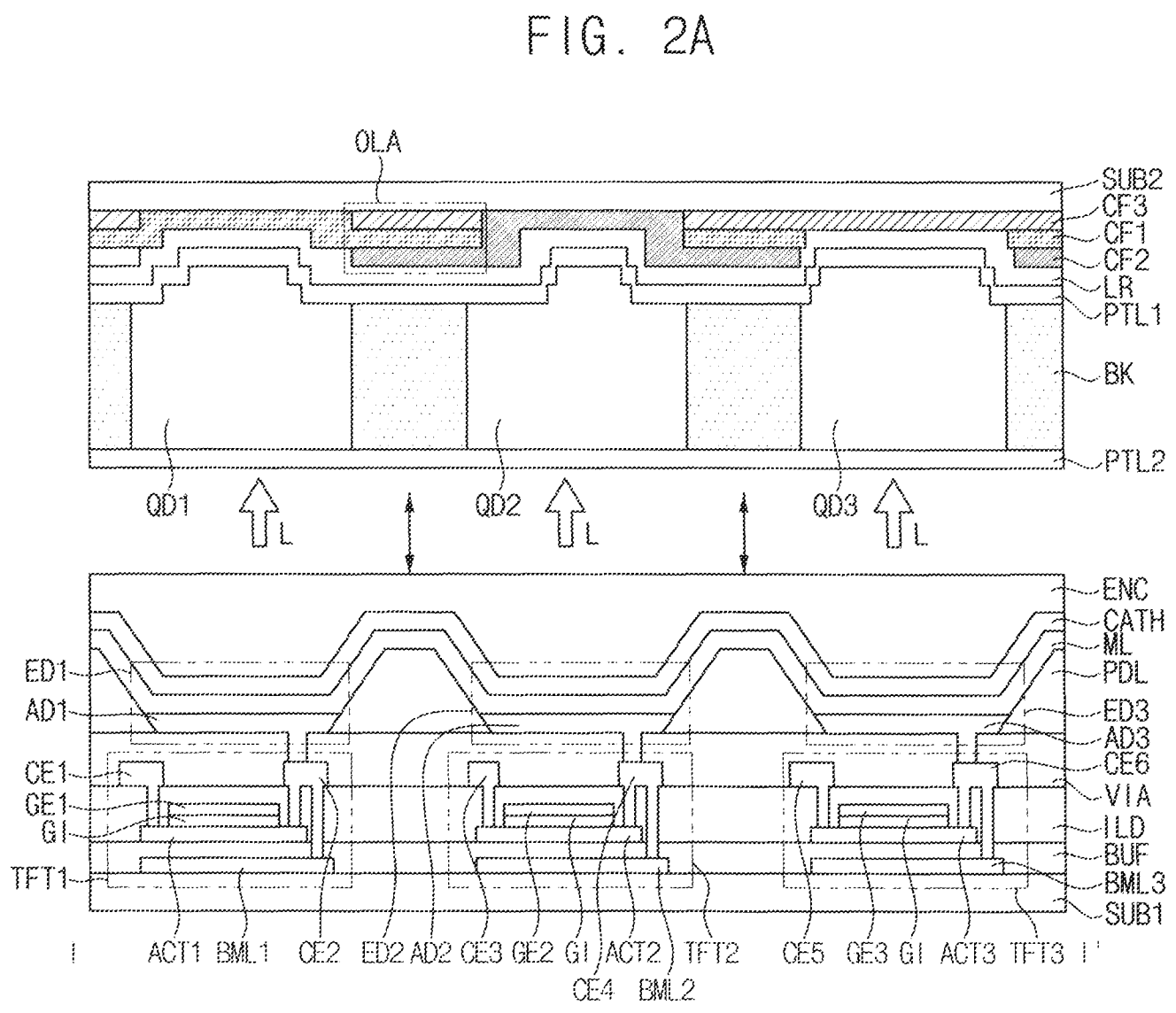
Figure 2B:
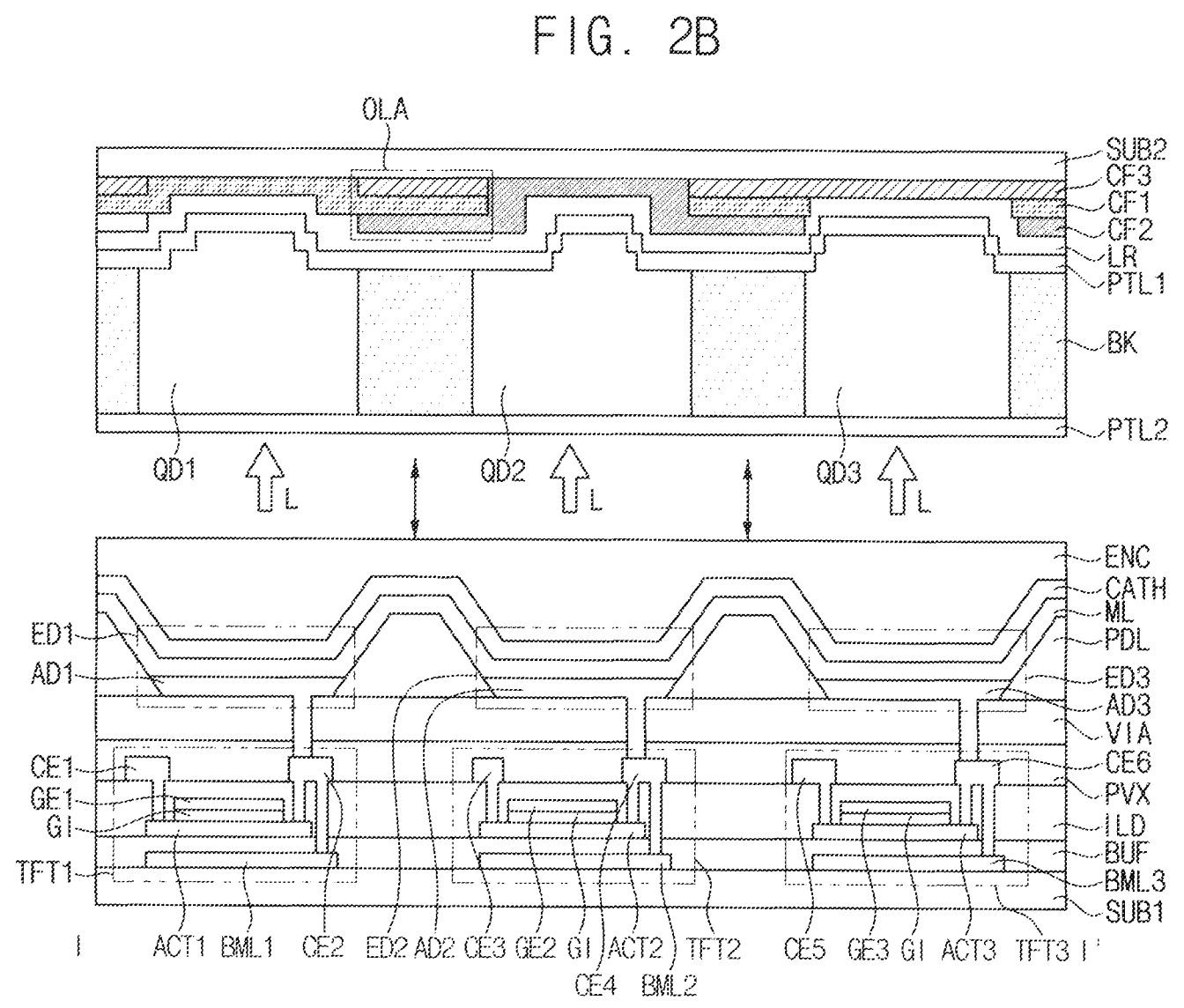

FIGS. 2A and 2B are schematic sectional views taken along line I-I' of the display device of FIG. 1 according to an embodiment.

Referring to FIGS. 1 and 2A, the display device DD may include a first substrate SUB1, first to third lower electrodes BML1, BML2, and BML3, a buffer layer BUF, first to third transistors TFT1, TFT2, and TFT3, a gate insulating layer GI, an interlayer insulating layer ILD, a via insulating layer VIA, first to third light emitting elements ED1, ED2, and ED3, an encapsulation layer ENC, a second substrate SUB2, first to third color filters CF1, CF2, and CF3, a refractive layer LR, a first protective layer PTL1, first to third color conversion layers QD1, QD2, and QD3, a bank layer BK, and a second protective layer PTL2.

The first transistor TFT1 may include a first active layer ACT1, a first gate electrode GE1, a first upper electrode CE1, and a second upper electrode CE2. The second transistor TFT2 may include a second active layer ACT2, a second gate electrode GE2, a third upper electrode CE3, and a fourth upper electrode CE4. The third transistor TFT3 may include a third active layer ACTS, a third gate electrode GE3, a fifth upper electrode CE5, and a sixth upper electrode CE6.

The first light emitting element ED1 may include a first anode electrode AD1, a middle layer ML, and a cathode electrode CATH. The second light emitting element ED2 may include a second anode electrode AD2, a middle layer ML, and a cathode electrode CATH. The third light emitting element ED3 may include a third anode electrode AD3, a middle layer ML, and a cathode electrode CATH.

The first substrate SUB1 may include glass. Therefore, the first substrate SUB1 may have rigidity. In other embodiments, in case that the first substrate SUB1 is patterned or fabricated with a specific thickness or less, the first substrate SUB1 may have flexibility.

The first to third lower electrodes BML1, BML2, and BML3 may be disposed on the first substrate SUB1. A signal transmitted from an outside may be transmitted to the first to third lower electrodes BML1, BML2, and BML3. Further, the first to third lower electrodes BML1, BML2, and BML3 may serve to block external light. Each of the first to third lower electrodes BML1, BML2, and BML3 may include a metal, metal oxide, metal nitride, and the like. Examples of the metal include silver, molybdenum, aluminum, tungsten (W), copper (Cu), nickel (Ni), chromium (Cr), titanium (Ti), tantalum (Ta), platinum (Pt), scandium (Sc), and the like. These may be used alone or in combination with each other. Examples of the metal oxide include indium-tin oxide (ITO), indium-zinc oxide (IZO), and the like. These may be used alone or in combination with each other. Examples of the metal nitride include aluminum nitride (AlN$_x$), tungsten nitride (WN$_x$), chromium nitride (CrN$_x$), and the like. These may be used alone or in combination with each other.

The buffer layer BUF may be disposed on the first substrate SUB1. The buffer layer BUF may include an inorganic insulating material. Examples of the inorganic insulating material include silicon oxide (SiO$_x$), silicon nitride (SiN$_x$), silicon oxynitride (SiO$_x$N$_y$), and the like. These may be used alone or in combination with each other. The buffer layer BUF may prevent metal atoms or impurities from diffusing into the first to third active layers ACT1, ACT2, and ACT3. The buffer layer BUF may control a rate of heat provided to the first to third active layers ACT1, ACT2, and ACT3 during a crystallization process for forming the first to third active layers ACT1, ACT2, and ACT3.

The first to third active layers ACT1, ACT2, and ACT3 may be disposed on the buffer layer BUF. In some embodiments, each of the first to third active layers ACT1, ACT2, and ACT3 may include a silicon semiconductor. Examples of the silicon semiconductor include at least one of amorphous silicon, polycrystalline silicon, and the like. In other embodiments, each of the first to third active layers ACT1, ACT2, and ACT3 may include an oxide semiconductor. Examples of the oxide semiconductor include indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), and the like, or a combination thereof. However, embodiments are not limited thereto.

The gate insulating layer GI may be disposed on the first to third active layers ACT1, ACT2, and ACT3. The gate insulating layer GI may serve to insulate the first to third active layers ACT1, ACT2, and ACT3 from the first to third gate electrodes GE1, GE2, and GE3. The gate insulating layer GI may include an inorganic insulating material. Examples of the inorganic insulating material include silicon oxide (SiO$_x$), silicon nitride (SiN$_x$), silicon oxynitride (SiO$_x$N$_y$), and the like. These may be used alone or in combination with each other.

The first to third gate electrodes GE1, GE2, and GE3 may be disposed on the gate insulating layer GI. Although the first to third gate electrodes GE1, GE2, and GE3 have been shown in FIG. 2 as overlapping the gate insulating layer GI, the embodiments are not limited thereto. For example, a length of each of the first to third gate electrodes GE1, GE2, and GE3 may be shorter than a length of the gate insulating layer GI when viewed in a sectional view. The first to third gate electrodes GE1, GE2, and GE3 may partially overlap the first to third active layers ACT1, ACT2, and ACT3, respectively. In response to gate signals provided to the first to third gate electrodes GE1, GE2, and GE3, signals and/or voltages may flow through the first to third active layers ACT1, ACT2, and ACT3. Each of the first to third gate electrodes GE1, GE2, and GE3 may include a metal, metal oxide, metal nitride, and the like. Examples of the metal include silver, molybdenum, aluminum, tungsten (W), copper (Cu), nickel (Ni), chromium (Cr), titanium (Ti), tantalum (Ta), platinum (Pt), scandium (Sc), and the like. These may be used alone or in combination with each other. Examples of the metal oxide include indium-tin oxide (ITO), indium-zinc oxide (IZO), and the like. These may be used alone or in combination with each other. Examples of the metal nitride include aluminum nitride ($AlN_x$), tungsten nitride ($WN_x$) chromium nitride ($CrN_x$), and the like. These may be used alone or in combination with each other.

The interlayer insulating layer ILD may be disposed on the gate insulating layer GI. The interlayer insulating layer ILD may cover the first to third gate electrodes GE1, GE2, and GE3. The interlayer insulating layer ILD may include an inorganic insulating material. Examples of the inorganic insulating material include silicon oxide ($SiO_x$), silicon nitride ($SiN_x$), silicon oxynitride ($SiO_xN_y$), and the like. These may be used alone or in combination with each other.

The first to sixth upper electrodes CE1, CE2, CE3, CE4, CE5, and CE6 may be disposed on the interlayer insulating layer ILD. The first upper electrode CE1 and the second upper electrode CE2 may be connected to the first active layer ACT1 through contact holes, respectively. The second upper electrode CE2 may be connected to the first lower electrode BML1 through a contact hole. The first upper electrode CE1 may correspond to a source or drain electrode. The second upper electrode CE2 may correspond to a drain or source electrode. The third upper electrode CE3 and the fourth upper electrode CE4 may be connected to the second active layer ACT2 through contact holes, respectively. The fourth upper electrode CE4 may be connected to the second lower electrode BML2 through a contact hole. The third upper electrode CE3 may correspond to a source or drain electrode. The fourth upper electrode CE4 may correspond to a drain or a source electrode. The fifth upper electrode CE5 and the sixth upper electrode CE6 may be connected to the third active layer ACT3 through contact holes, respectively. The sixth upper electrode CE6 may be connected to the third lower electrode BML3 through a contact hole. The fifth upper electrode CE5 may correspond to a source or drain electrode. The sixth upper electrode CE6 may correspond to a drain or source electrode. Each of the first to sixth upper electrodes CE1, CE2, CE3, CE4, CE5, and CE6 may include a metal, metal oxide, metal nitride, and the like. Examples of the metal include silver, molybdenum, aluminum, tungsten (W), copper (Cu), nickel (Ni), chromium (Cr), titanium (Ti), tantalum (Ta), platinum (Pt), scandium (Sc), and the like. These may be used alone or in combination with each other. Examples of the metal oxide include indium-tin oxide (ITO), indium-zinc oxide (IZO), and the like. These may be used alone or in combination with each other. Examples of the metal nitride include aluminum nitride ($AlN_x$), tungsten nitride ($WN_x$) chromium nitride ($CrN_x$), and the like. These may be used alone or in combination with each other.

The via insulating layer VIA may be disposed on the interlayer insulating layer ILD. The via insulating layer VIA may cover the first to sixth upper electrodes CE1, CE2, CE3, CE4, CE5, and CE6. The via insulating layer VIA may have a substantially flat top surface. The via insulating layer VIA may include an organic insulating material. Examples of the organic insulating material include a photoresist, a poly-acryl-based resin, a polyimide-based resin, an acryl-based resin, and the like. These may be used alone or in combination with each other.

In other embodiments, as shown in FIG. 2B, a passivation layer PVX may be disposed between the via insulating layer VIA and the interlayer insulating layer ILD. The passivation layer PVX may include an inorganic insulating material.

Examples of the inorganic insulating material include silicon oxide ($SiO_x$), silicon nitride ($SiN_x$), silicon oxynitride ($SiO_xN_y$), and the like. These may be used alone or in combination with each other.

The first to third anode electrodes AD1, AD2, and AD3 may be disposed on the via insulating layer VIA. The first to third anode electrodes AD1, AD2, and AD3 may be connected to the second, fourth, and sixth upper electrodes CE2, CE4, and CE6, respectively. Each of the first to third anode electrodes AD1, AD2, and AD3 may include a metal, metal oxide, metal nitride, and the like.

A pixel defining layer PDL may be disposed on the via insulating layer VIA. The pixel defining layer PDL may have openings exposing the first to third anode electrodes AD1, AD2, and AD3, respectively. The pixel defining layer PDL may include an organic insulating material.

The middle layer ML may be disposed on the first to third anode electrodes AD1, AD2, and AD3. The middle layer ML may include an organic material for emitting a light having a preset color. For example, all of the middle layers ML may include an organic material for emitting a blue light. The middle layers ML may emit the light based on potential differences between the cathode electrode CATH and the first to third anode electrodes AD1, AD2, and AD3, respectively. The middle layer ML may include an electron injection layer, an electron transport layer, a light emitting layer, a hole transport layer, and a hole injection layer. The middle layer ML may have a structure in which light emitting layers for emitting blue lights may be stacked on each other. For example, the middle layer ML may have a structure in which three light emitting layers for emitting blue lights may be stacked on each other. In other embodiments, the middle layer ML may have a structure in which mutually different light emitting layers may be stacked on each other. For example, the middle layer ML may have a structure in which three light emitting layers for emitting blue lights and one light emitting layer for emitting a green light may be stacked on each other. However, since the above configuration has been provided for illustrative purposes, the middle layer ML may have a structure in which light emitting layers may be stacked in various ways in addition to the above structure.

The cathode electrode CATH may be disposed on the middle layers ML. The cathode electrode CATH may include a metal, metal oxide, metal nitride, and the like, or a combination thereof.

The encapsulation layer ENC may be disposed on the cathode electrode CATH. The encapsulation layer ENC may have a stacked structure of inorganic layer/organic layer/inorganic layer. The encapsulation layer ENC may serve to protect the first to third light emitting elements ED1, ED2, and ED3 from external impacts and materials. The encapsulation layer ENC may have a substantially flat top surface.

Components ranging from the first substrate SUB1 to the encapsulation layer ENC may constitute an element substrate including a light emitting element and a driving element.

The second substrate SUB2 may include glass. Therefore, the second substrate SUB2 may have rigidity. In other embodiments, in case that the second substrate SUB2 is patterned or fabricated with a specific thickness or less, the second substrate SUB2 may have flexibility.

The first to third color filters CF1, CF2, and CF3 may be disposed on the second substrate SUB2. The first to third color filters CF1, CF2, and CF3 may filter lights emitted from lower portions thereof so as to emit only a light having a desired color to an outside of the display device DD. The first to third color filters CF1, CF2, and CF3 may partially overlap each other. The first to third color filters CF1, CF2, and CF3 may block the lights emitted from the lower portions thereof from being emitted to the outside. For example, since the first to third color filters CF1, CF2, and CF3 may overlap each other in a light blocking area OLA, lights L emitted from the lower portions of the first to third color filters CF1, CF2, and CF3 may not escape to the outside. Accordingly, the display device DD may emit the light having the desired color at a desired position.

The refractive layer LR may be disposed on the first to third color filters CF1, CF2, and CF3. The refractive layer LR may control light paths of the lights L emitted from the lower portions of the first to third color filters CF1, CF2, and CF3. For example, the refractive layer LR may change a path of an obliquely incident light in a direction that may be perpendicular to the second substrate SUB2. The refractive layer LR may include a polymer material and a silica-based material. Moisture may penetrate through the refractive layer LR. The moisture penetrating through the refractive layer LR may damage the display device DD. Therefore, it may be necessary to prevent the moisture from penetrating from the refractive layer LR disposed in the non-display area NDA to the display area DA.

The first protective layer PTL1 may be disposed on the refractive layer LR. The first protective layer PTL1 may include an inorganic insulating material. The first protective layer PTL1 may serve to protect the refractive layer LR. Examples of the inorganic insulating material include silicon oxide ($SiO_x$), silicon nitride ($SiN_x$), silicon oxynitride ($SiO_xN_y$), and the like. These may be used alone or in combination with each other.

The bank layer BK and the first to third color conversion layers QD1, QD2, and QD3 may be disposed on the first protective layer PTL1. The first to third color conversion layers QD1, QD2, and QD3 may be partitioned from each other by the bank layer BK. The bank layer BK may overlap the pixel defining layer PDL. The bank layer BK may include an organic insulating material. The first to third color conversion layers QD1, QD2, and QD3 may convert colors of the lights L emitted from the first to third light emitting elements ED1, ED2, and ED3. For example, all of the first to third light emitting elements ED1, ED2, and ED3 may emit blue lights. The first color conversion layer QD1 may convert the blue light into a red light, the second color conversion layer QD2 may convert the blue light into a green light, and the third color conversion layer QD3 may transmit the blue light.

The second protective layer PTL2 may cover the bank layer BK and the first to third color conversion layers QD1, QD2, and QD3. Accordingly, the second protective layer PTL2 may protect the bank layer BK and the first to third color conversion layers QD1, QD2, and QD3. The second protective layer PTL2 may include an inorganic insulating material. Examples of the inorganic insulating material include silicon oxide ($SiO_x$), silicon nitride ($SiN_x$), silicon oxynitride ($SiO_xN_y$), and the like. These may be used alone or in combination with each other.

Components ranging from the second substrate SUB2 to the second protective layer PTL2 may be separately fabricated so as to be bonded to the components ranging from the first substrate SUB1 to the encapsulation layer ENC. The components ranging from the second substrate SUB2 to the second protective layer PTL2 may be sequentially fabricated. The components ranging from the second substrate SUB2 to the second protective layer PTL2 may be bonded to the components ranging from the first substrate SUB1 to the encapsulation layer ENC by a sealing member and a filling material.

Figure 3:
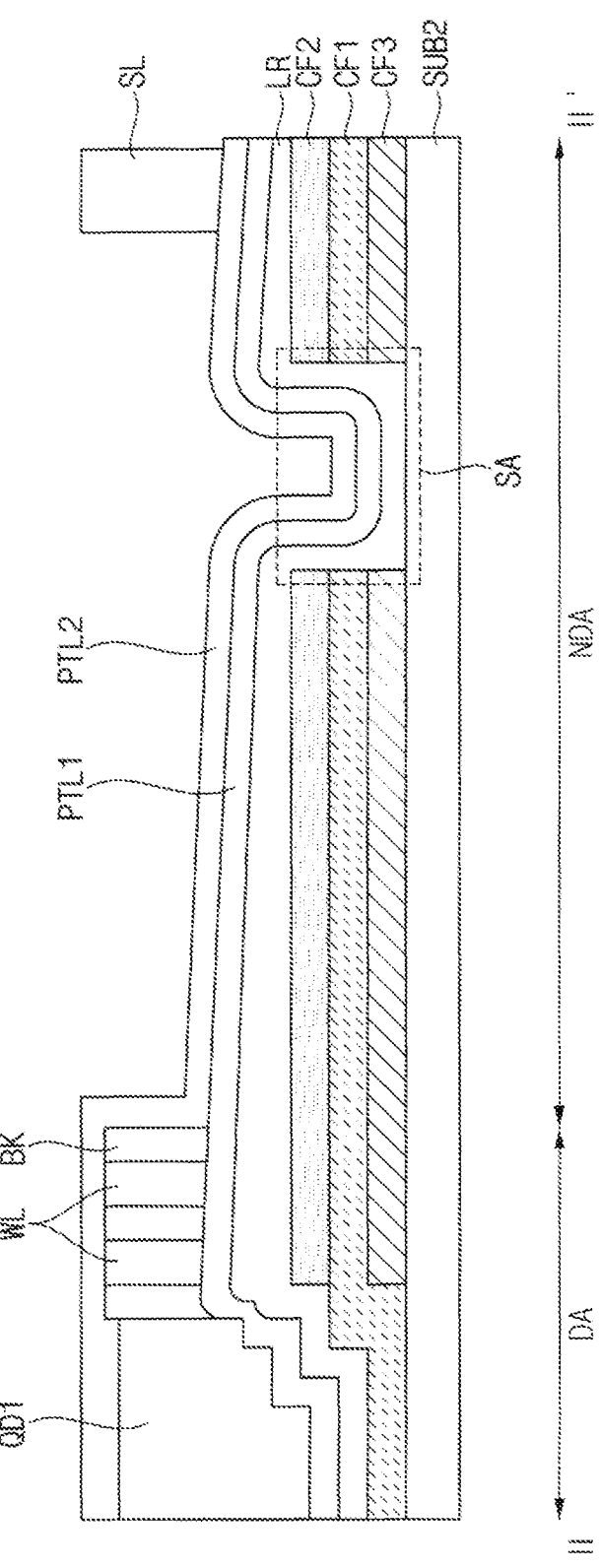
FIG. 3 is a schematic sectional view taken along line II-II' of the display device of FIG. 1 according to an embodiment.

FIG. 3 is a schematic sectional view taken along line II-II' of the display device of FIG. 1 according to an embodiment. In FIG. 3, the element substrate has been omitted for convenience of description.

Referring to FIGS. 1 and 3, the first to third color filters CF1, CF2, and CF3 may overlap each other in the non-display area NDA. In the non-display area NDA, the first to third color filters CF1, CF2, and CF3 may include an opening SA exposing the second substrate SUB2.

In FIG. 3, a material for forming the refractive layer LR may be applied onto the color filters CF1, CF2, and CF3 disposed on a left side of the opening SA. Due to the opening SA, refractive materials applied onto the first to third color filters CF1, CF2, and CF3 may flow into the opening SA. Accordingly, a thickness of the refractive layer LR may be decreased in an area adjacent to the opening SA. In other words, the thickness of the refractive layer LR may be gradually decreased from the display area DA to the non-display area NDA.

In FIG. 3, the material for forming the refractive layer LR may be applied onto the color filters CF1, CF2, and CF3 disposed on a right side of the opening SA. The material for forming the refractive layer LR may flow to an outer periphery of the non-display area NDA. Accordingly, the thickness of the refractive layer LR may be gradually decreased toward the outer periphery of the non-display area NDA, and an area of the refractive layer LR making contact with the outside may be reduced. Accordingly, the display device DD may effectively block moisture penetrating from the outside.

The first protective layer PTL1 and the second protective layer PTL2 may be disposed on the refractive layer LR, and the first protective layer PTL1 and the second protective layer PTL2 may make contact with each other.

A sealing member SL may be disposed at the outer periphery the non-display area NDA. The sealing member SL may serve to prevent an external material from penetrating into a gap between the first substrate SUB1 and the second substrate SUB2 in a process of bonding the first substrate SUB1 and the second substrate SUB2 to each other.

In some embodiments, a concave part WL may be formed in the bank layer BK. The concave part WL may be defined as a space for accommodating an ink that may be erroneously jetted in a process of forming the first color conversion layer QD1. The concave part WL may also be formed in the bank layer BK that may be adjacent to the second and third color conversion layers QD2 and QD3 of FIG. 2.

Figure 4:
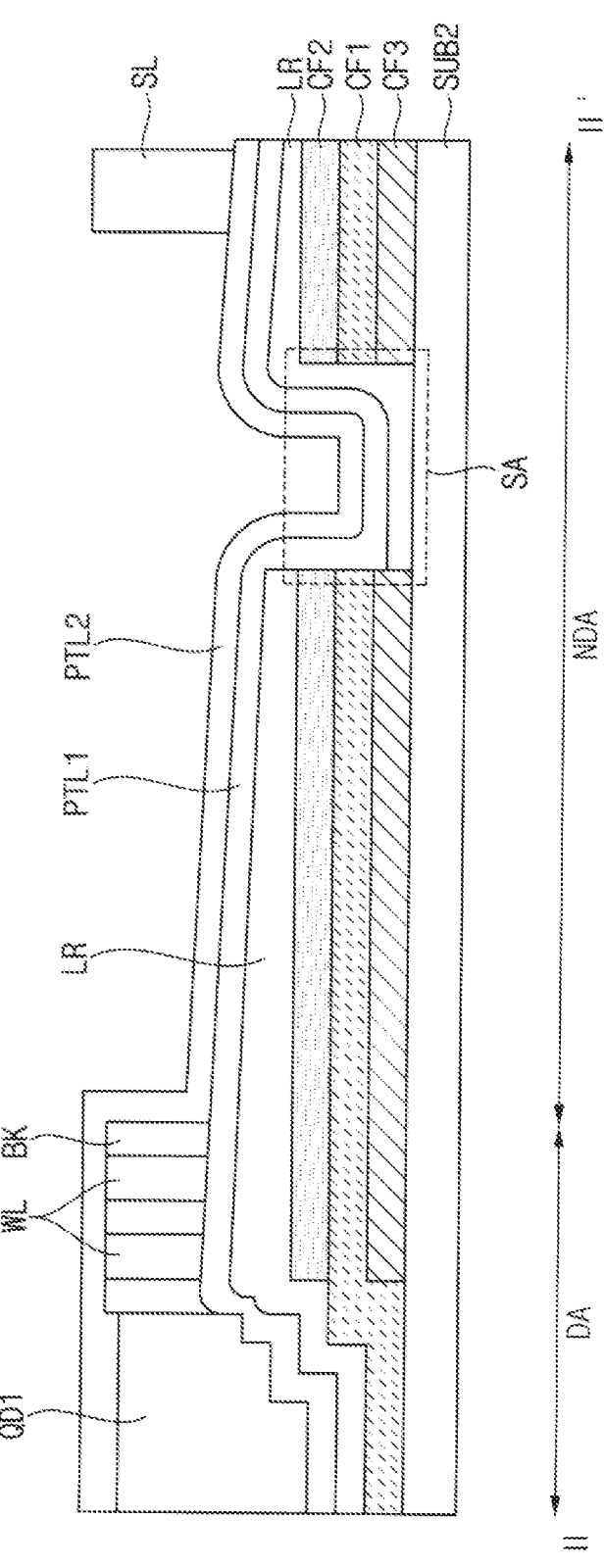
FIG. 4 is a schematic sectional view taken along line II-II' of the display device of FIG. 1 according to another embodiment.

FIG. 4 is a schematic sectional view taken along line II-II' of the display device of FIG. 1 according to another embodiment. FIG. 4 may be substantially the same as FIG. 3 except at least that the refractive layer LR may be cut at the opening SA. Accordingly, redundant descriptions of components will be omitted.

Referring to FIGS. 1 and 4, in a process of forming the refractive layer LR, the refractive layer LR may be cut by a step formed by the opening SA. Moisture penetrating from the right side of the opening SA may be prevented from reaching the display area DA.

Figure 5:
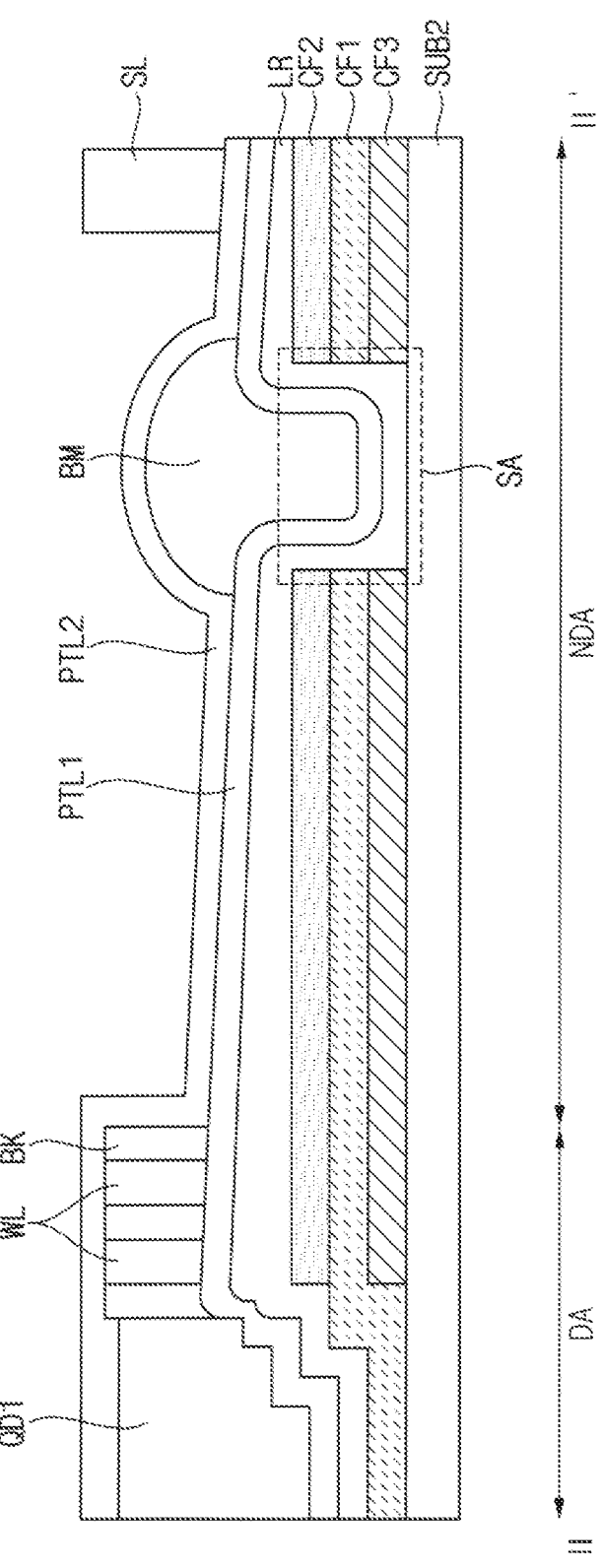
FIG. 5 is a schematic sectional view taken along line II-II' of the display device of FIG. 1 according to still another embodiment.

FIG. 5 is a schematic sectional view taken along line II-II' of the display device of FIG. 1 according to still another embodiment. FIG. 5 may be substantially the same as FIG.

3 except at least that a light blocking member BM may fill the opening SA. Accordingly, redundant descriptions of components will be omitted.

Referring to FIGS. 1 and 5, the first to third color filters CF1, CF2, and CF3 may not be disposed in the opening SA, so that the lights emitted from the lower portions of the first to third color filters CF1, CF2, and CF3 may be transmitted through the opening SA. In order to prevent the above transmission, the light blocking member BM may fill the opening SA. The light blocking member BM may include substantially the same material as the bank layer BK and/or the pixel defining layer PDL.

Figure 6:
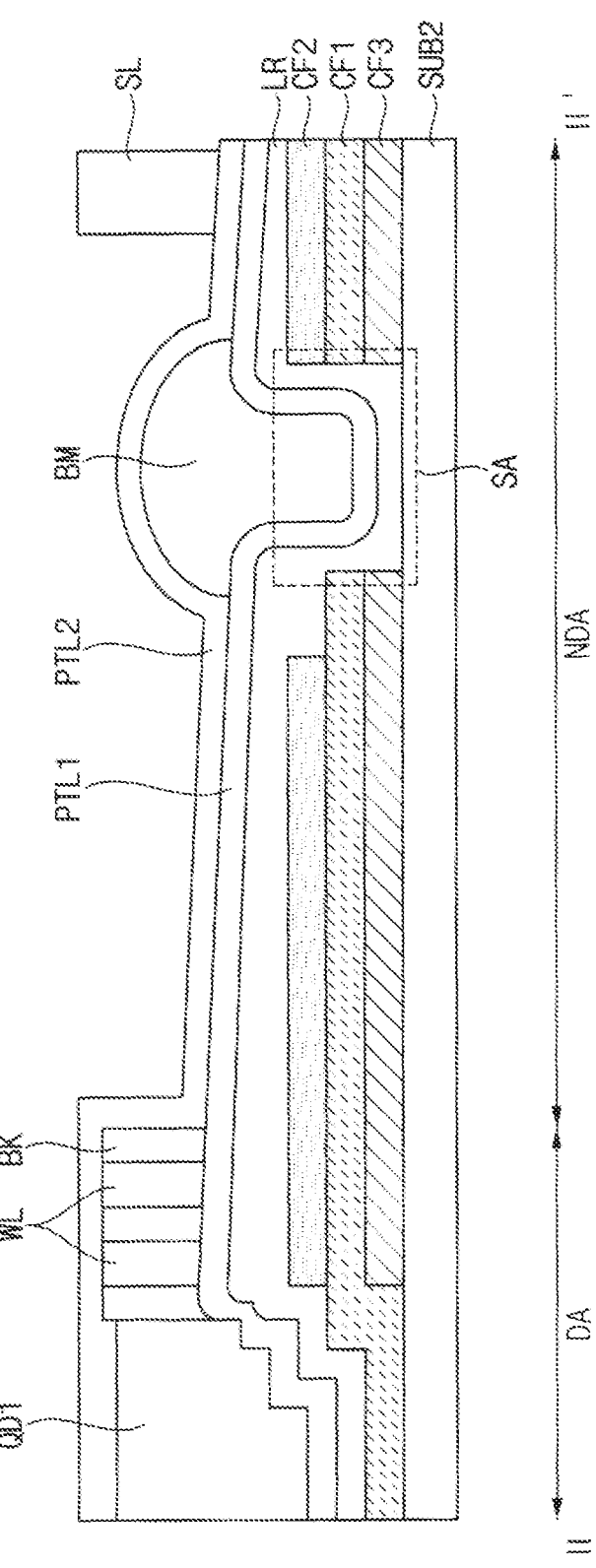
FIG. 6 is a schematic sectional view taken along line II-II' of the display device of FIG. 1 according to yet another embodiment.

FIG. 6 is a schematic sectional view taken along line II-II' of the display device of FIG. 1 according to yet another embodiment. FIG. 6 may be substantially the same as FIG. 5 except at least that a step may be formed by the first and second color filters CF1 and CF2. Accordingly, redundant descriptions of components will be omitted.

Referring to FIGS. 1 and 6, the step may be formed between the first color filter CF1 and the second color filter CF2 by the second color filter CF2 in the non-display area NDA. The material for forming the refractive layer LR applied onto the first to third color filters CF1, CF2, and CF3 may effectively flow into the opening SA.

Figure 7:
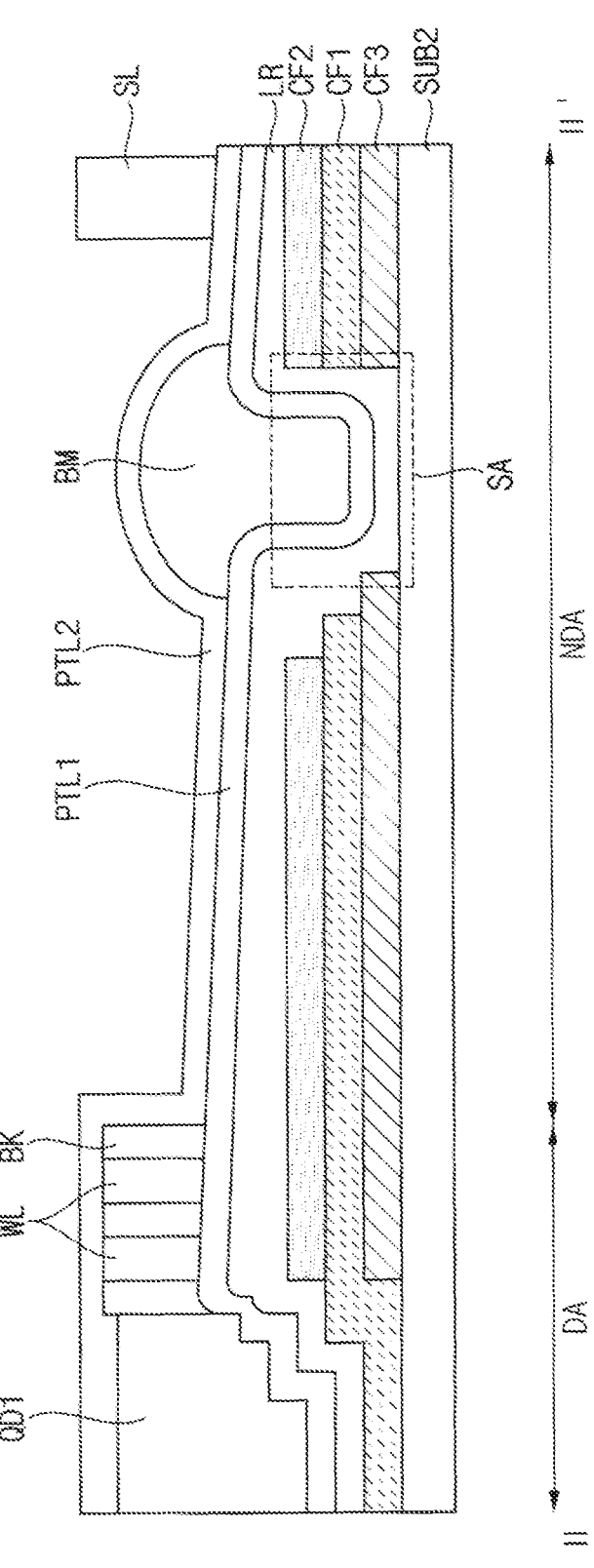
FIG. 7 is a schematic sectional view taken along line II-II' of the display device of FIG. 1 according to still another embodiment.

FIG. 7 is a schematic sectional view taken along line II-II' of the display device of FIG. 1 according to still another embodiment. FIG. 7 may be substantially the same as FIG. 5 except at least that steps may be formed by the first to third color filters CF1, CF2, and CF3. Accordingly, redundant descriptions of components will be omitted.

Referring to FIGS. 1 and 7, the steps may be formed among the first to third color filters CF1, CF2, and CF3 in the non-display area NDA. The material for forming the refractive layer LR applied onto the first to third color filters CF1, CF2, and CF3 may effectively flow into the opening SA.

Figure 8:
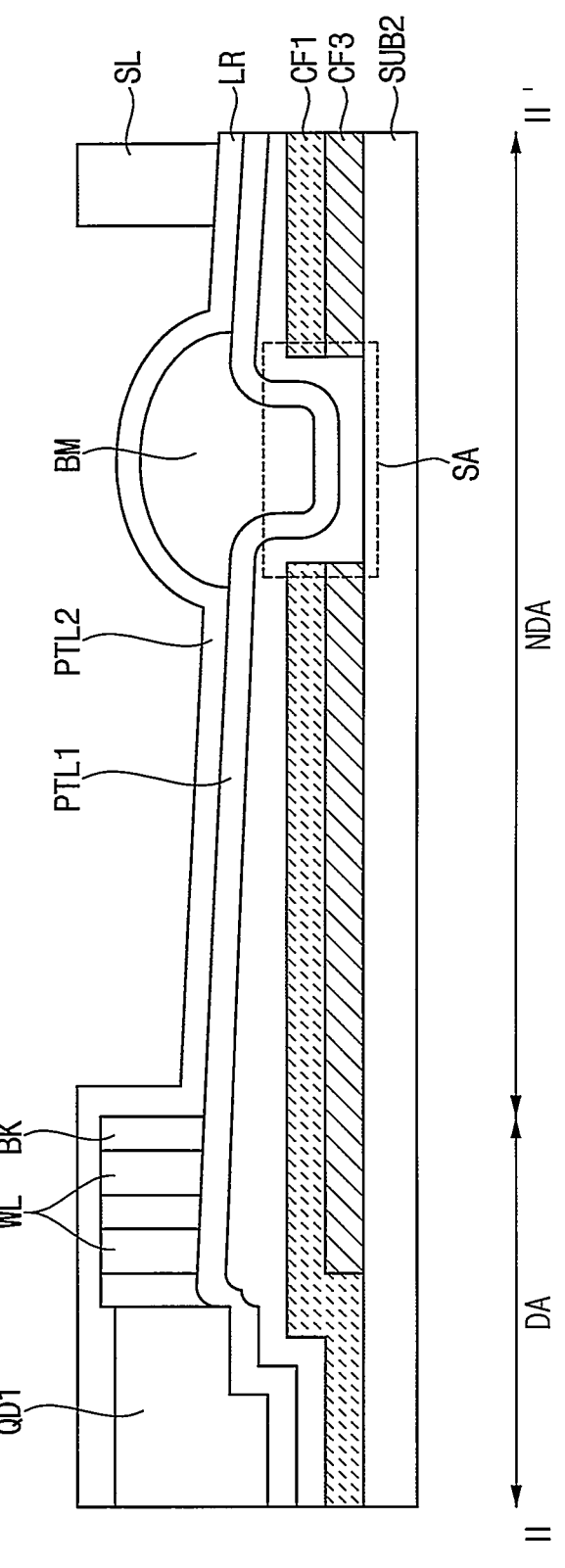
FIG. 8 is a schematic sectional view taken along line II-II' of the display device of FIG. 1 according to yet another embodiment.

FIG. 8 is a schematic sectional view taken along line II-II' of the display device of FIG. 1 according to yet another embodiment. FIG. 8 may be substantially the same as FIG. 5 except at least that the two color filters CF1 and CF3 may overlap each other in the non-display area NDA. Accordingly, redundant descriptions of components will be omitted.

Referring to FIGS. 1 and 8, only the two color filters CF1 and CF3 may be disposed in the non-display area NDA.

Figure 9:
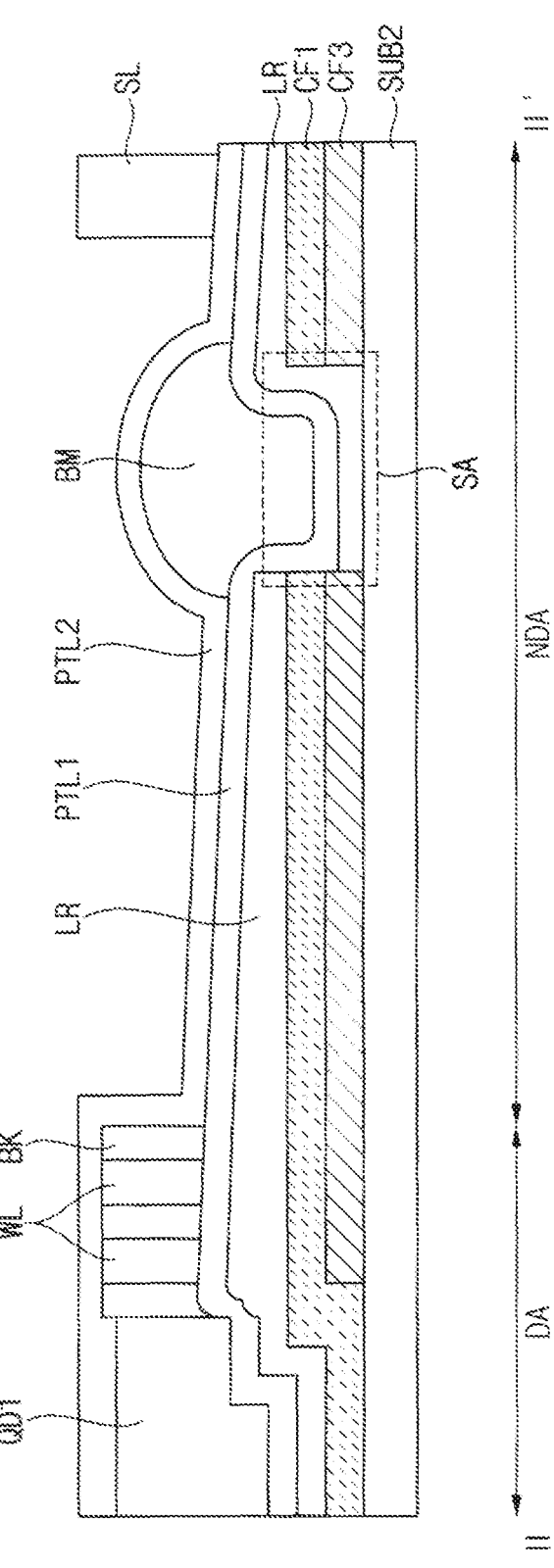
FIG. 9 is a schematic sectional view taken along line II-II' of the display device of FIG. 1 according to still another embodiment.

FIG. 9 is a schematic sectional view taken along line II-II' of the display device of FIG. 1 according to still another embodiment. FIG. 9 may be substantially the same as FIG. 8 except at least that the refractive layer LR may be cut at the opening SA. Accordingly, redundant descriptions of components will be omitted.

The refractive layer LR may be cut by a step formed by the opening SA. Moisture penetrating into the refractive layer LR disposed on the right side of the opening SA may be effectively blocked.

Figure 10:
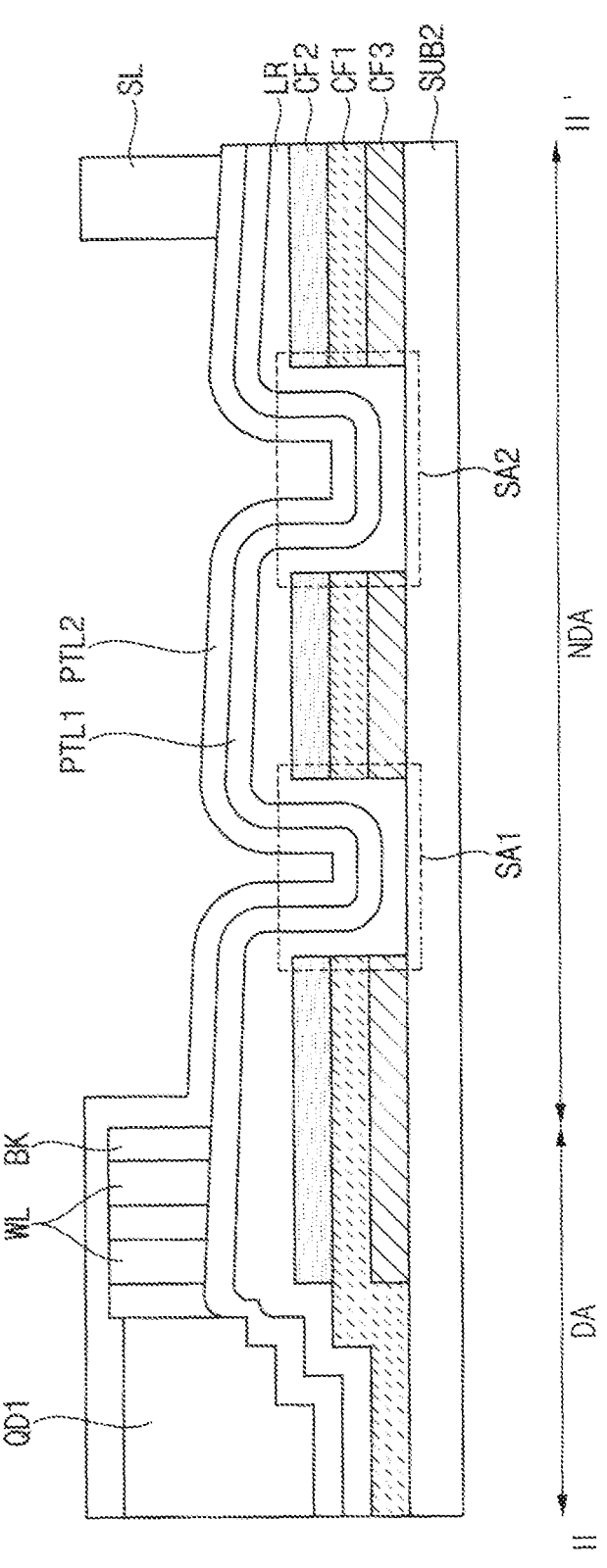
FIG. 10 is a schematic sectional view taken along line II-II' of the display device of FIG. 1 according to yet another embodiment.

FIG. 10 is a schematic sectional view taken along line II-II' of the display device of FIG. 1 according to yet another embodiment. FIG. 10 may be substantially the same as FIG. 3 except at least that two openings SA1 and SA2 may be formed in the non-display area NDA. Accordingly, redundant descriptions of components will be omitted.

Referring to FIGS. 1 and 10, the thickness of the refractive layer LR disposed on the color filters CF1, CF2, and CF3 adjacent to each of the openings SA1 and SA2 may be gradually decreased toward the outer periphery of the non-display area NDA. Accordingly, a passage in which moisture penetrates through the refractive layer LR may be narrowed, and the penetration of the moisture may be effectively prevented.

FIG. 11 is a schematic sectional view taken along line II-II' of the display device of FIG. 1 according to still another embodiment, and FIG. 12 is a schematic sectional view taken along line II-II' of the display device of FIG. 1 according to yet another embodiment.

FIG. 11 may be substantially the same as FIG. 10 except at least that the refractive layer LR may be cut at the first opening SA1. Accordingly, redundant descriptions of components will be omitted.

Referring to FIGS. 1 and 11, the refractive layer LR may be cut by a step formed by the first opening SA1. However, since FIG. 11 has been provided for illustrative purposes, the refractive layer LR may be disconnected at the second opening SA2 without being disconnected at the first opening SA1. In other embodiments, as shown in FIG. 12, the refractive layer LR may be disconnected at each of the first and second openings SA1 and SA2.

Figure 13:
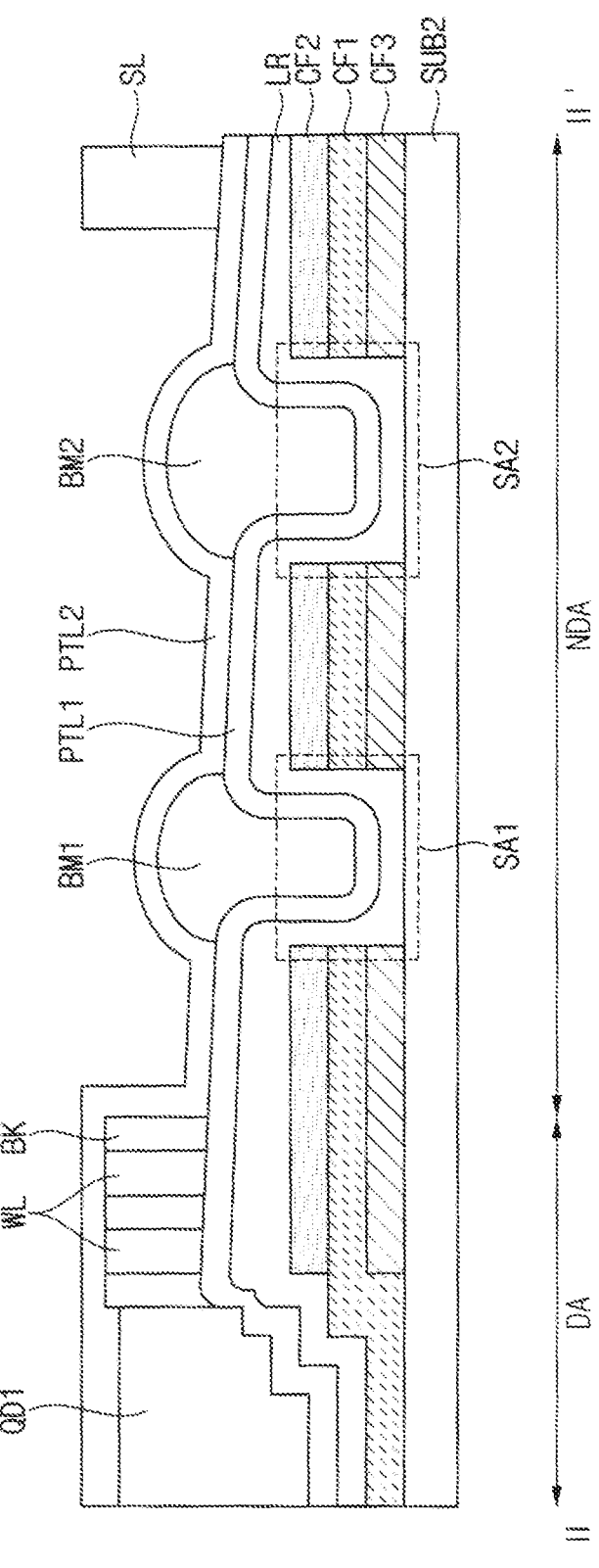
FIG. 13 is a schematic sectional view taken along line II-II' of the display device of FIG. 1 according to still another embodiment.

FIG. 13 is a schematic sectional view taken along line II-II' of the display device of FIG. 1 according to still another embodiment. FIG. 13 may be substantially the same as FIG. 10 except at least that a first light blocking member BM1 and a second light blocking member BM2 may fill the first opening SA1 and the second opening SA2, respectively. Accordingly, redundant descriptions of components will be omitted.

Referring to FIGS. 1 and 13, the first light blocking member BM1 and the second light blocking member BM2 may be disposed in the first opening SA1 and the second opening SA2 in which the first to third color filters CF1, CF2, and CF3 are not disposed, respectively. Accordingly, the light may not be emitted in the non-display area NDA.

FIGS. 14 to 22 are schematic views showing a process of manufacturing the display device of FIG. 1.

Figure 14:
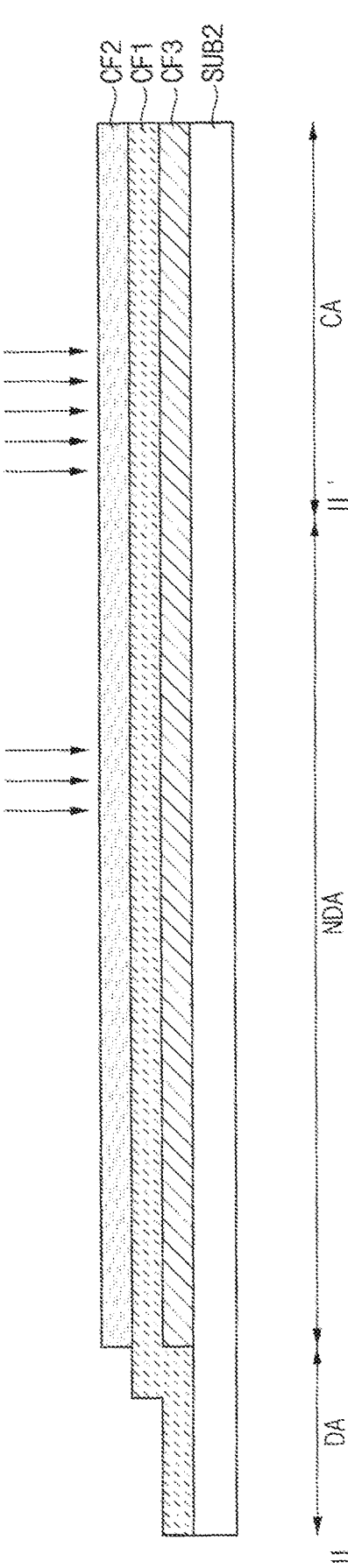
FIGS. 14 to 22 are schematic views showing a process of manufacturing the display device of FIG. 1.

Referring to FIGS. 1 and 14, first to third color filters CF1, CF2, and CF3 may be formed on a second substrate SUB2. However, since the above configuration has been provided for illustrative purposes, at least one color filter may be formed on the second substrate SUB2. The first to third color filters CF1, CF2, and CF3 disposed in a non-display area NDA may be partially removed. Accordingly, openings may be formed in the first to third color filters CF1, CF2, and CF3.

The second substrate SUB2 may be subsequently coupled to a first substrate SUB1. For example, as shown in FIG. 2, a driving element and a light emitting element connected to the driving element may be formed on the first substrate SUB1, and the first to third color filters CF1, CF2, and CF3, color conversion layers QD1, QD2, and QD3, a refractive layer LR, and the like may be formed on the second substrate SUB2. Thereafter, the first substrate SUB1 and the second substrate SUB2 may be coupled to each other such that the first substrate SUB1 and the second substrate SUB2 may be exposed to the outside.

In a process of manufacturing a display device DD, a cutting area CA connected to the non-display area NDA may exist. The cutting area CA may be subsequently removed so as not to exist in the display device DD. A display area DA and a non-display area NDA of the second substrate SUB2 may correspond to a display area DA and a non-display area NDA of the first substrate SUB1, respectively.

Figure 15:
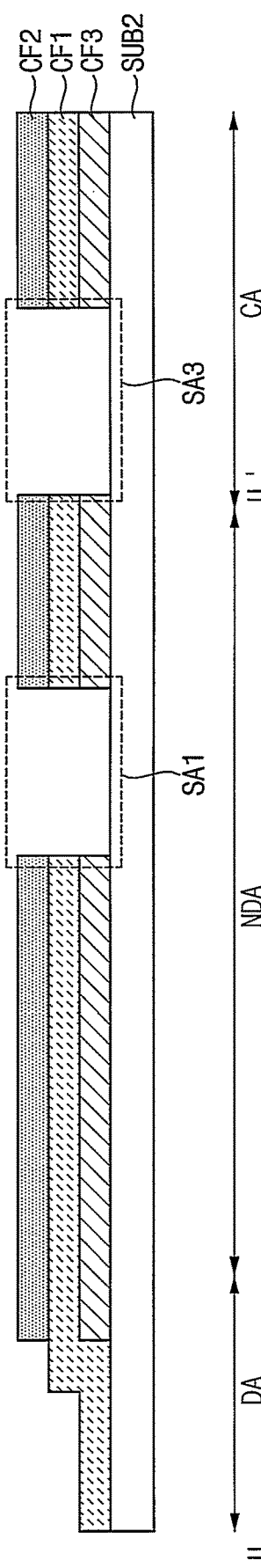

Referring to FIG. 15, a first opening SA1 may be formed in the non-display area NDA, and a third opening SA3 may be formed in the cutting area CA.

Figure 16:
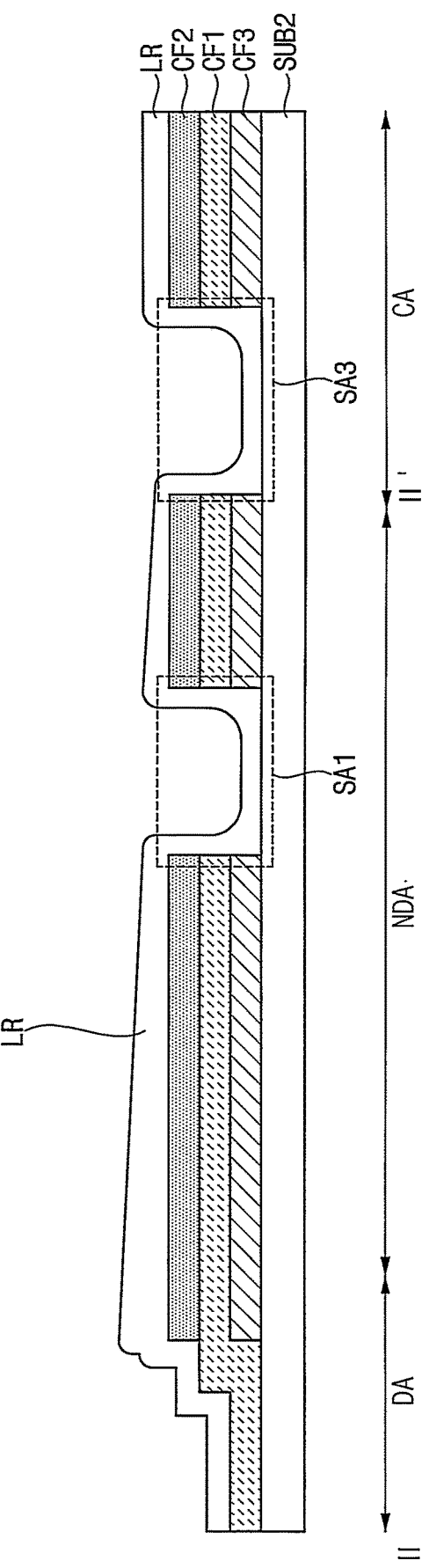

Referring to FIG. 16, a material for forming the refractive layer LR may be applied onto the first to third color filters CF1, CF2, and CF3. The material may flow into each of the first and third openings SA1 and SA3. Accordingly, the refractive layer LR having a thickness that may be gradually decreased as the refractive layer LR becomes away from the display area DA may be formed. In some embodiments, as described above, a step may be formed by color filters, and three or less color filters may overlap each other.

Figure 17:
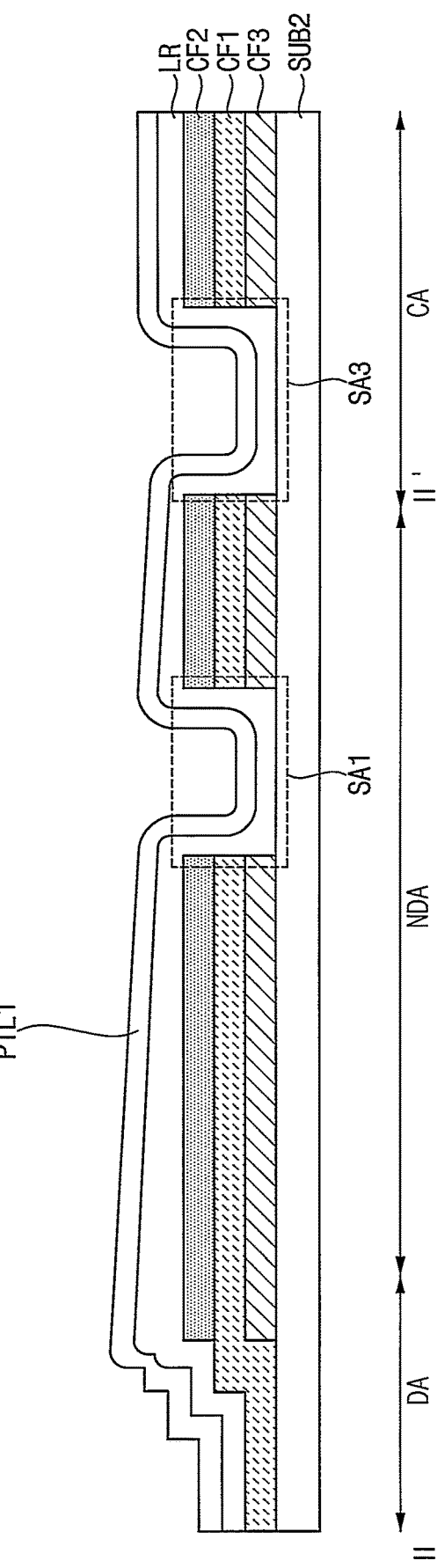

Referring to FIG. 17, a first protective layer PTL1 may be formed on the refractive layer LR.

Figure 18:
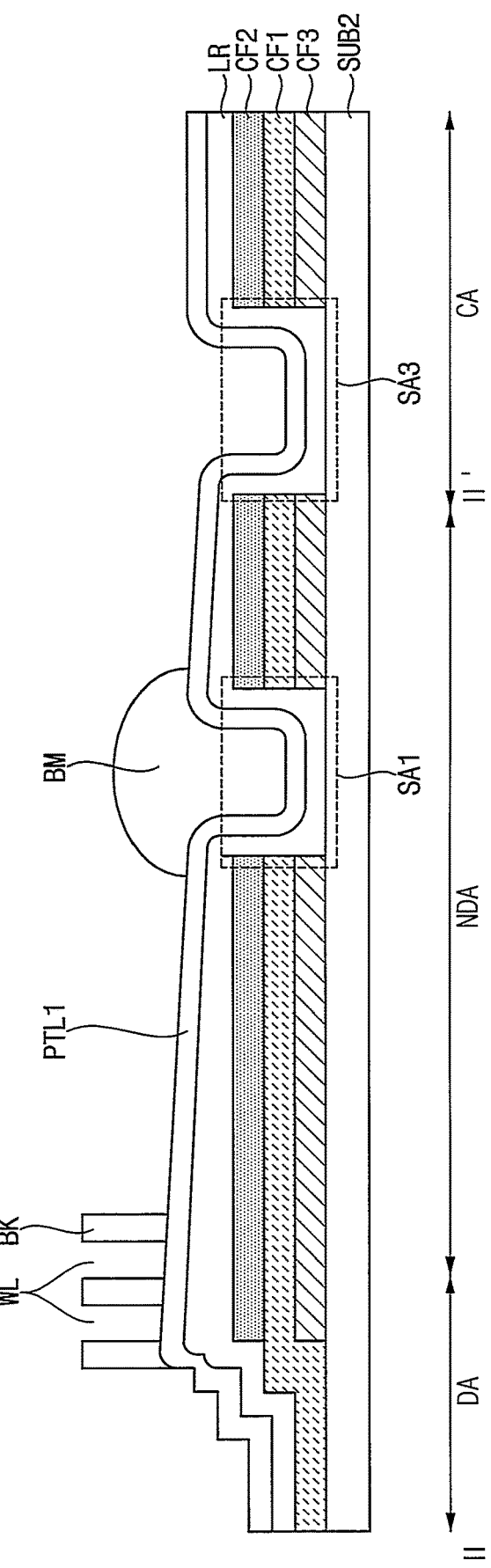

Referring to FIG. 18, a bank layer BK and alight blocking member BM may be formed. The bank layer BK may be disposed in the display area DA, and a concave part WL may be formed in the bank layer BK. The light blocking member BM may fill the first opening SA1.

Figure 19:
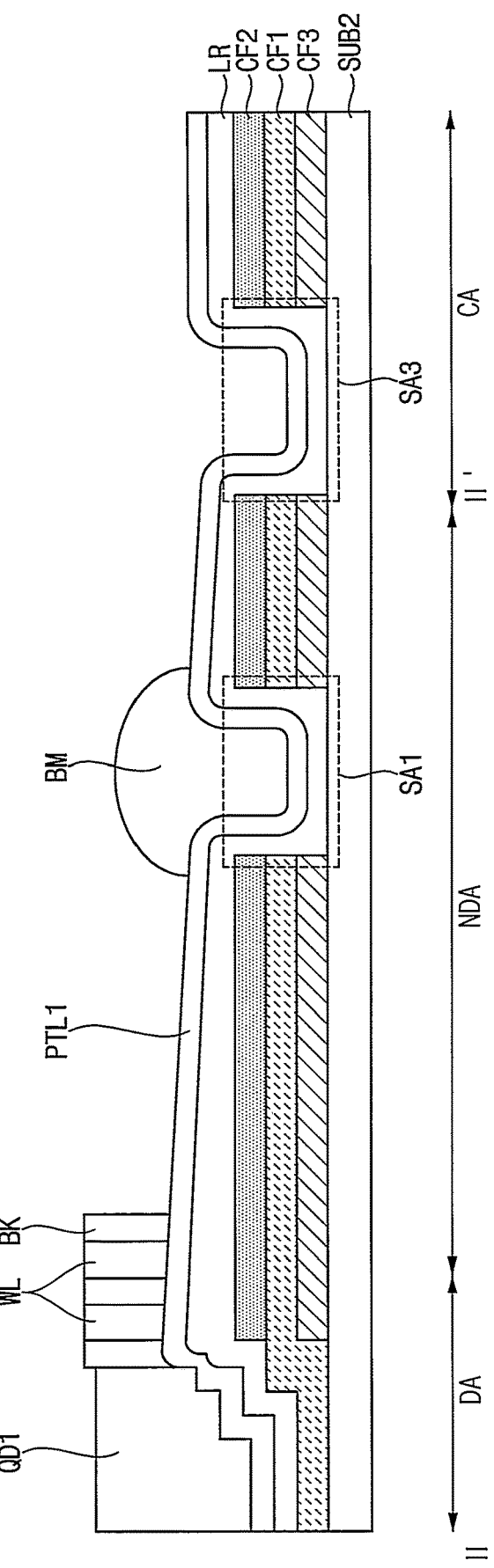

Referring to FIGS. 1 and 19, a first color conversion layer QD1 may be formed between bank layers BK. Although only the first color conversion layer QD1 has been shown in FIG. 19 for convenience, first to third color conversion layers QD1, QD2, and QD3 may be formed throughout the display area DA.

Figure 20:
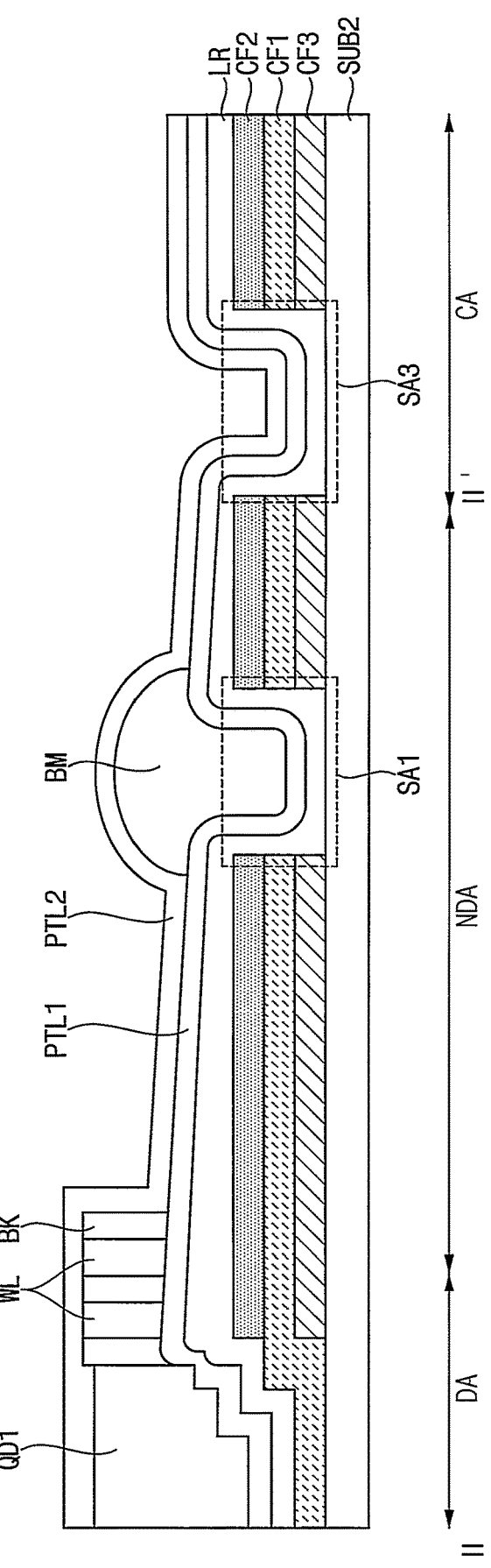

Referring to FIG. 20, a second protective layer PTL2 may cover the first color conversion layer QD1, the bank layer BK, the first protective layer PTL1, and the light blocking member BM.

Figure 21:
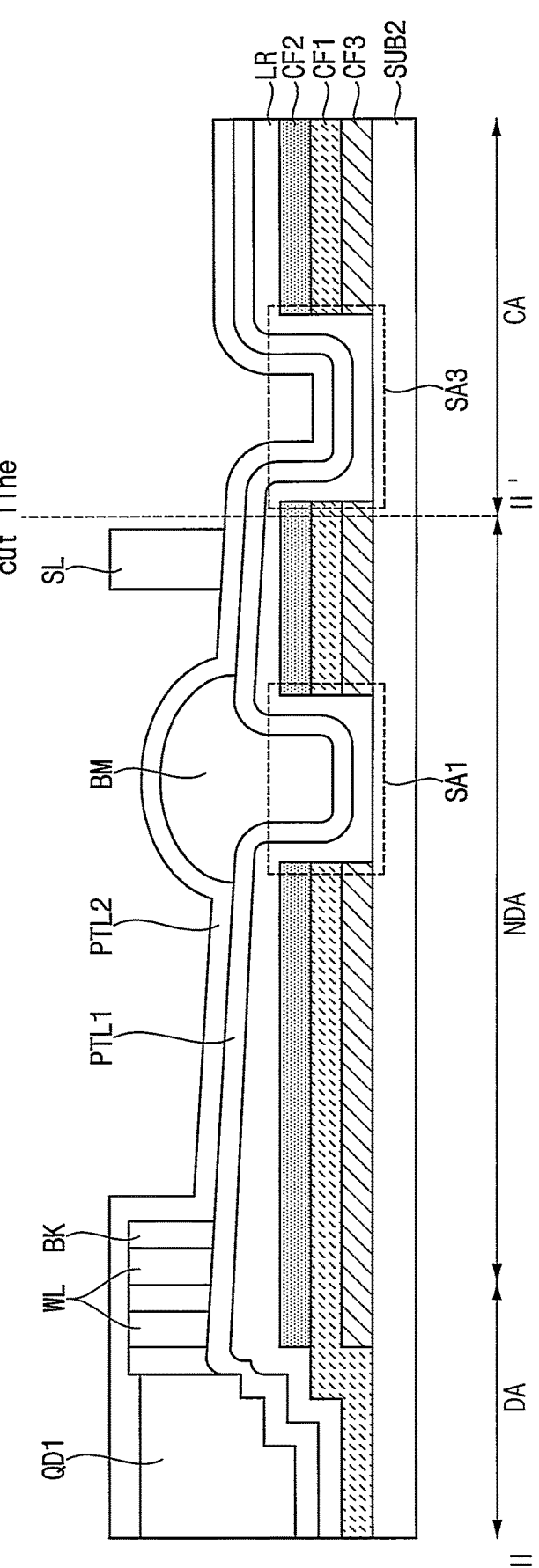
Figure 22:
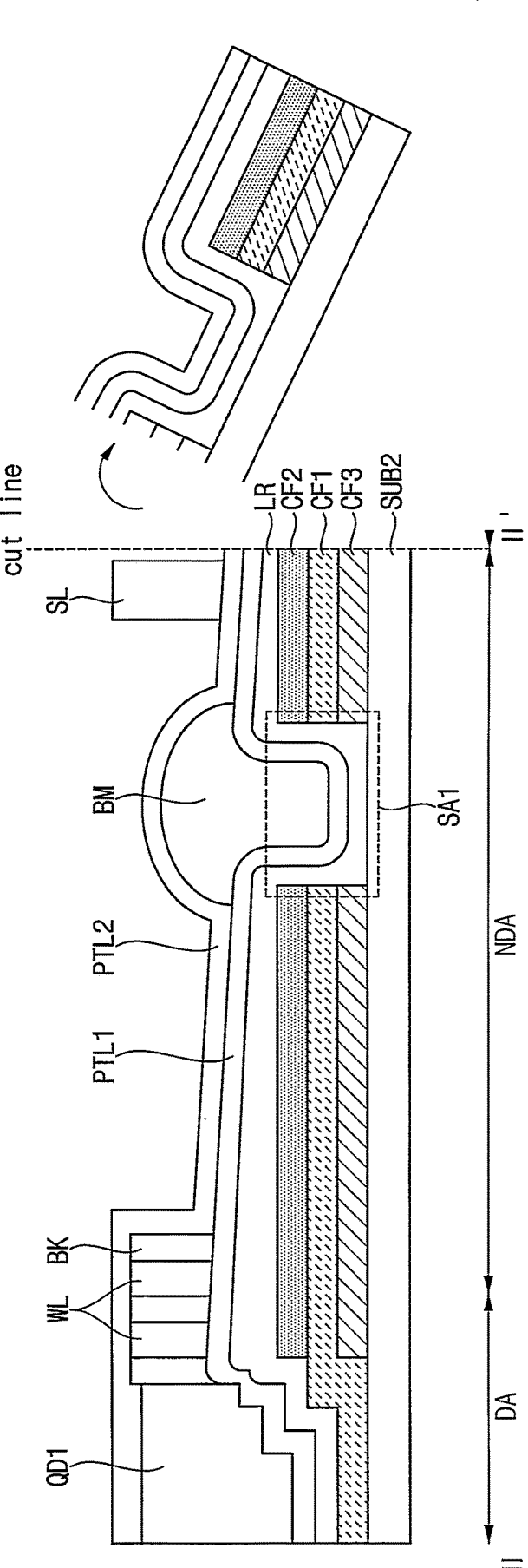
Figure 23:
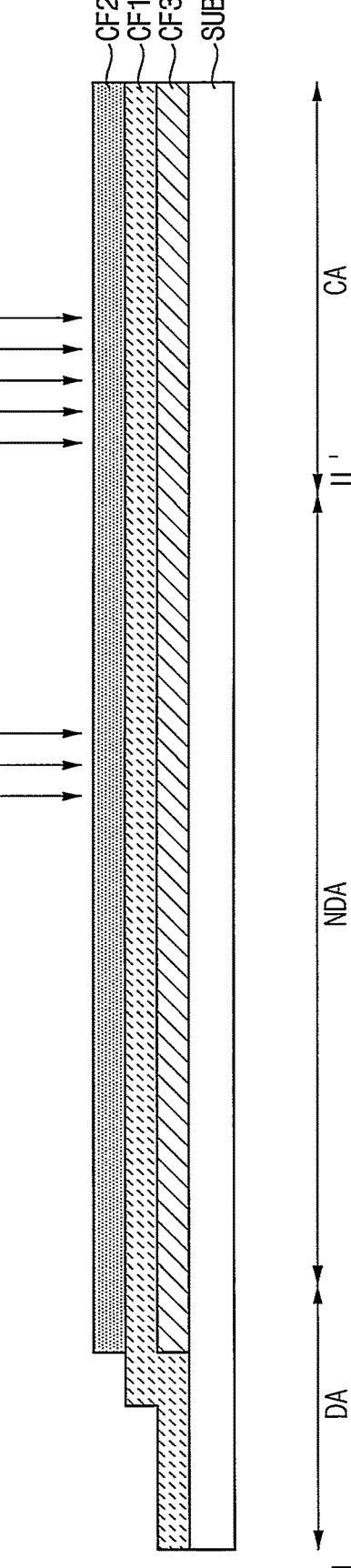
FIGS. 23 to 31 are schematic views showing a process of manufacturing the display device of FIG. 1.
Figure 24:
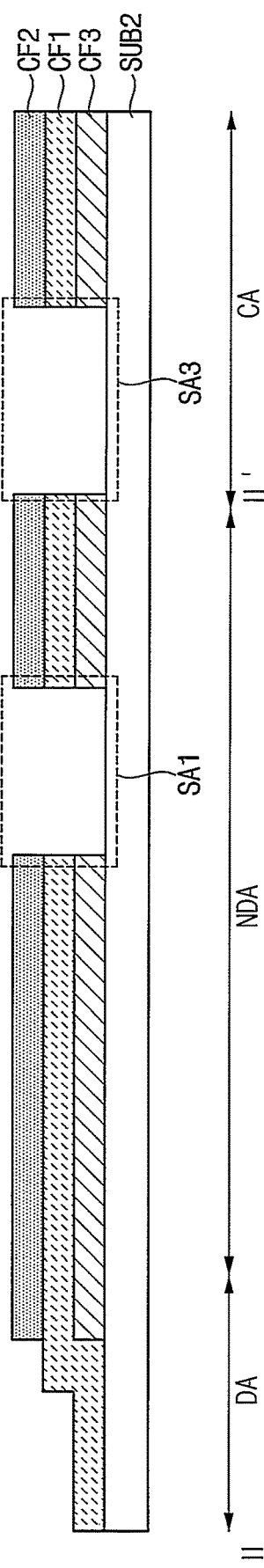

Referring to FIGS. 21 and 22, a sealing member SL may be formed between the first opening SA1 and the third opening SA3. Thereafter, the cutting area CA may be cut out so as to be removed through a cut line.

Due to the third opening SA3, the thickness of the refractive layer LR formed at an outer periphery of the non-display area NDA may be gradually decreased toward the outer periphery of the non-display area NDA.

A process of cutting the cutting area CA may be performed after the second substrate SUB2 may be bonded to the first substrate SUB1 as described above.

FIGS. 23 to 31 are schematic views showing a process of manufacturing the display device of FIG. 1. FIGS. 23 to 31 may be substantially the same as FIGS. 14 to 22 except at least that the refractive layer LR may be cut at the first opening SA1. Accordingly, redundant descriptions of components will be omitted.

Figure 25:
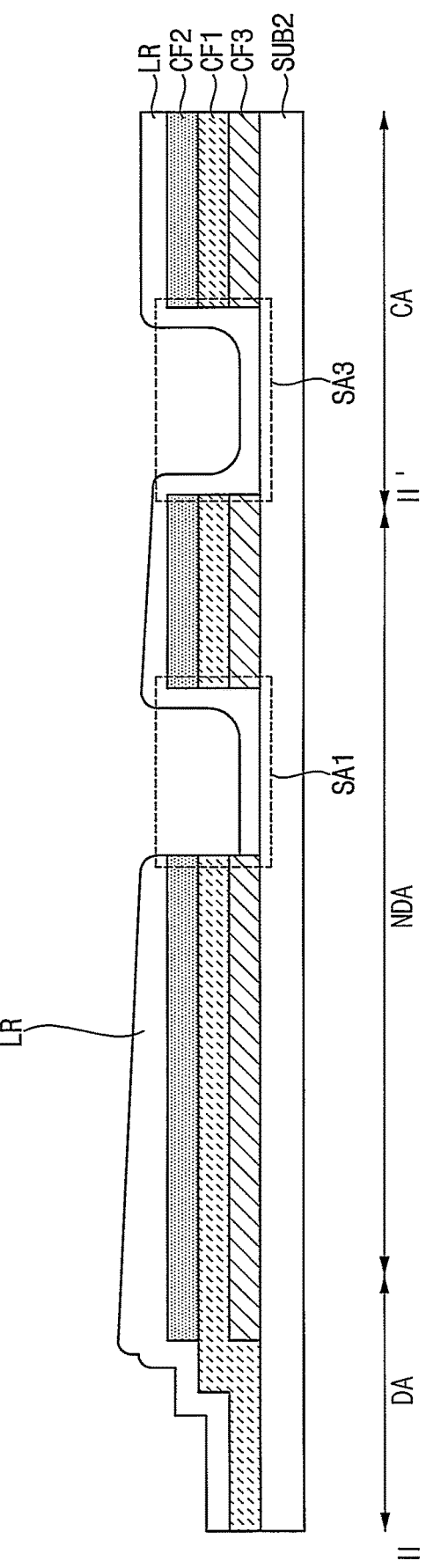
Figure 26:
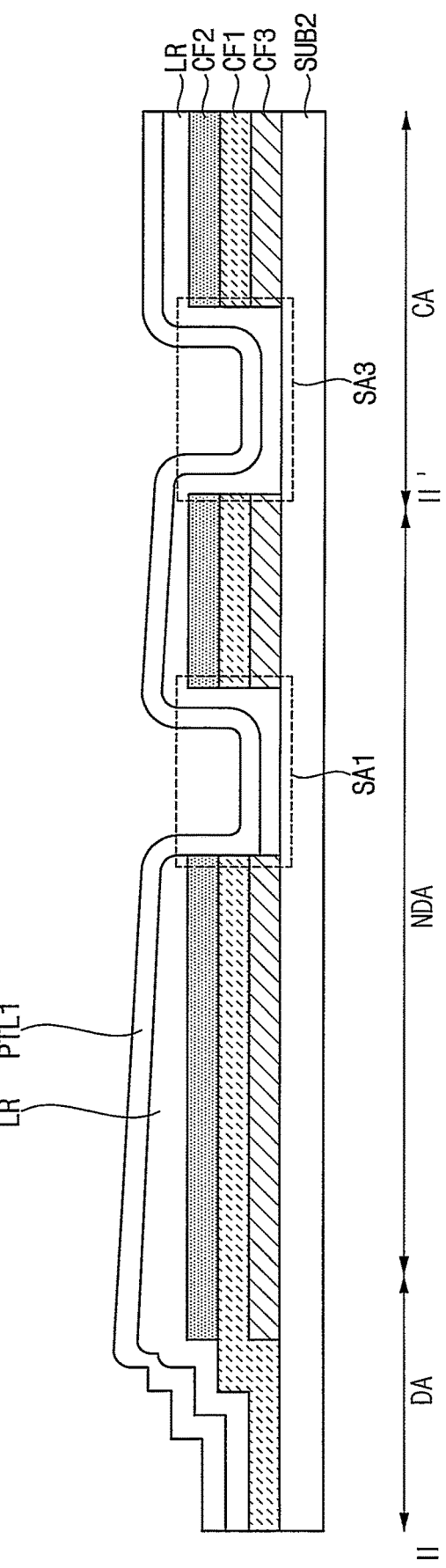
Figure 27:
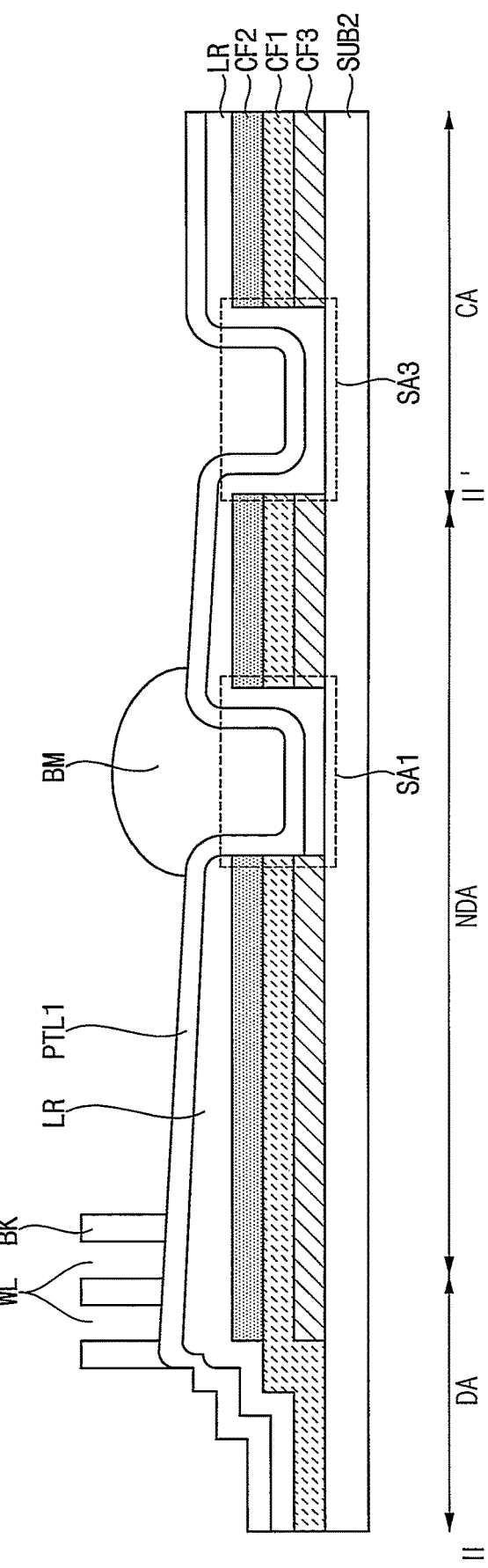
Figure 28:
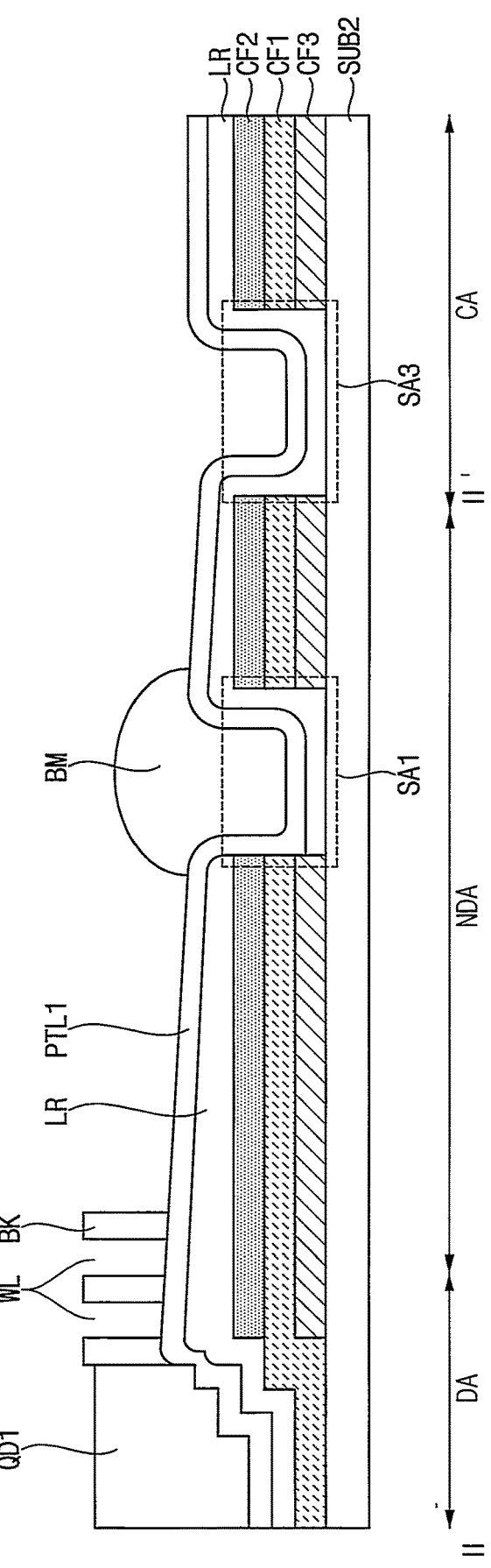
Figure 29:
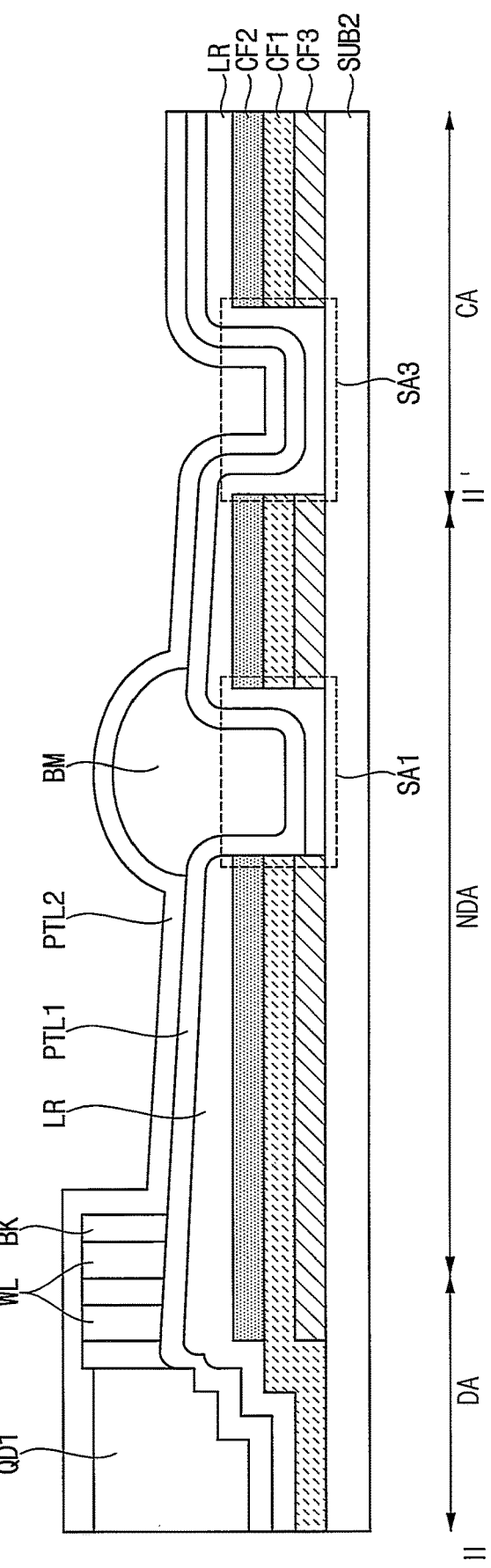
Figure 30:
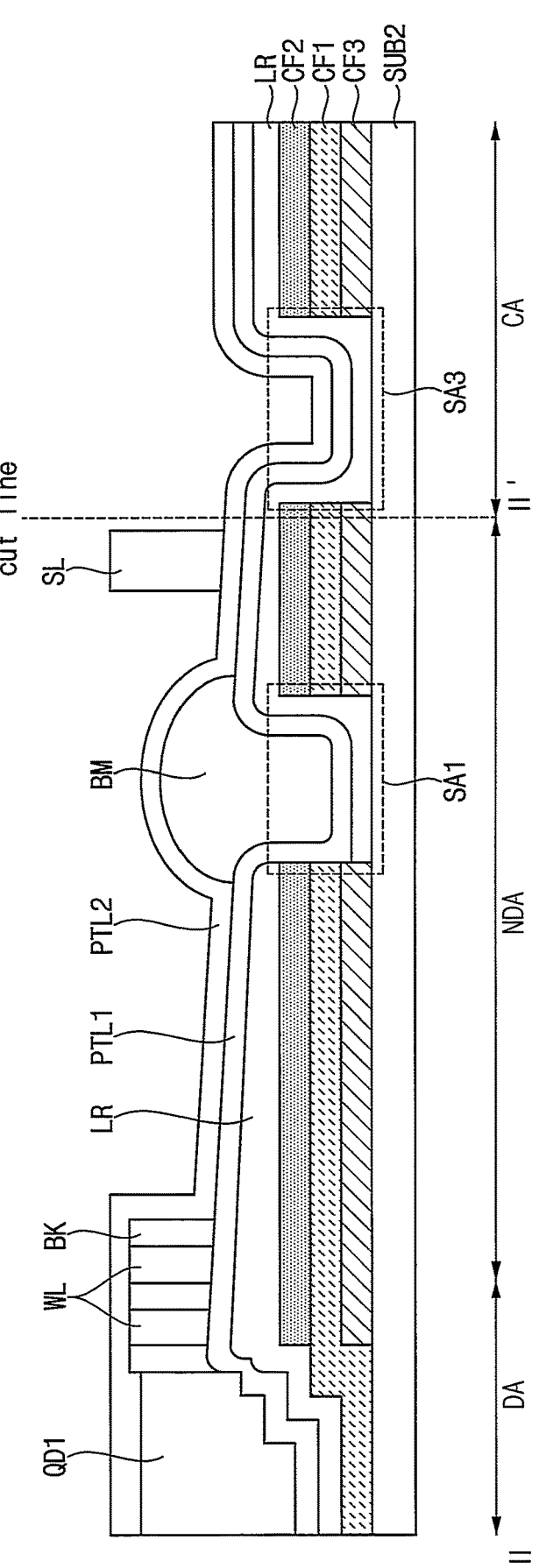
Figure 31:
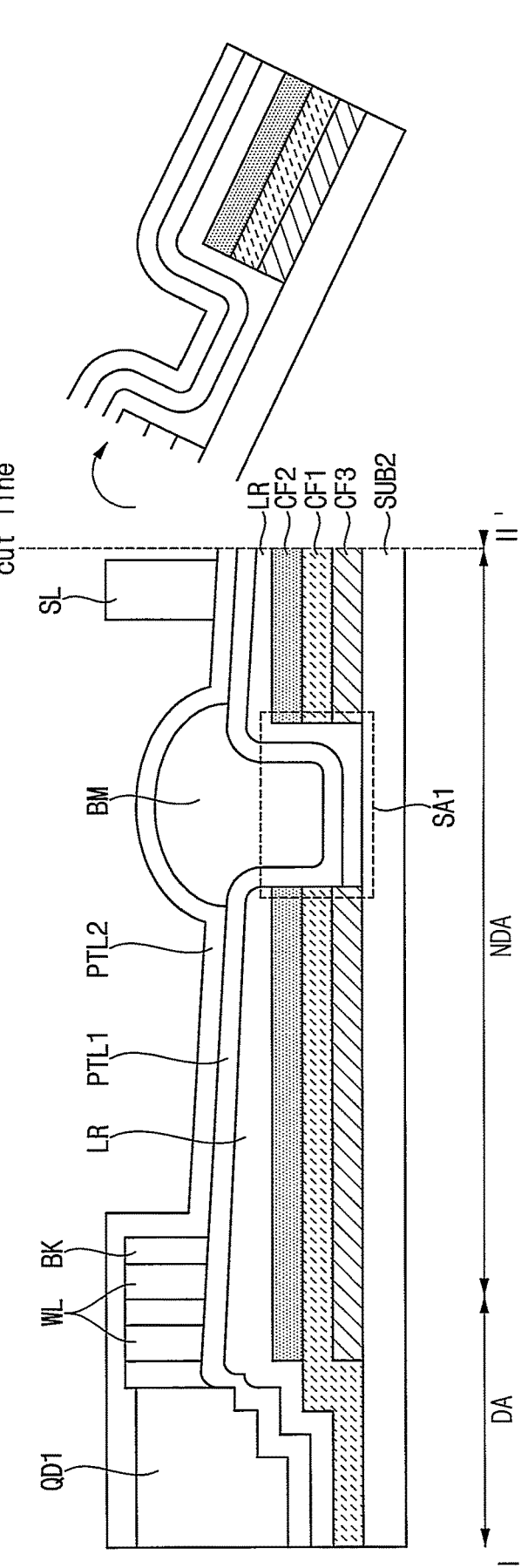

Referring to FIG. 25, a material for forming the refractive layer LR may be applied onto the color filters CF1, CF2, and CF3 adjacent to the first opening SA1. The material for forming the refractive layer LR may flow into the first opening SA1. The refractive layer LR may be cut by a step formed by the first opening SA1. Accordingly, moisture penetrating through the refractive layer LR may be effectively blocked.

The disclosure may be applied to a display device and a method of manufacturing the same. For example, the disclosure may be applied to a high-resolution smartphone, a mobile phone, a smart pad, a smart watch, a tablet PC, a vehicle navigation system, a television, a computer monitor, a laptop computer, and the like.

Although embodiments of the disclosure have been described above, it will be understood by those of ordinary skill in the art that various changes and modifications can be made to the disclosure without departing from the idea and scope of the disclosure as set forth herein.

What is claimed is:

1. A display device comprising:
a first substrate including a display area, and a non-display area adjacent to the display area;
a second substrate disposed on the first substrate, and facing the first substrate;

a first color filter disposed between the first substrate and the second substrate, and including a first opening in the non-display area; and
a refractive layer disposed between the first substrate and the first color filter, overlapping the display area and the non-display area in a plan view, and filling the first opening in the non-display area,
wherein a thickness of the refractive layer overlapping the first color filter in the non-display area in a plan view decreases farther from the display area.

2. The display device of claim 1, further comprising:
a second color filter disposed between the first color filter and the refractive layer, and exposing the second substrate in an area overlapping the first opening in a plan view.

3. The display device of claim 2, wherein the second color filter exposes the first color filter in an area adjacent to the first opening.

4. The display device of claim 2, further comprising:
a third color filter disposed between the second color filter and the refractive layer, and exposing the second substrate in an area overlapping the first opening in a plan view.

5. The display device of claim 4, wherein the third color filter exposes the second color filter in an area adjacent to the first opening.

6. The display device of claim 1, further comprising:
a light blocking member disposed on the refractive layer and filling the first opening.

7. The display device of claim 1, wherein the refractive layer is cut at the first opening.

8. The display device of claim 1, wherein the first color filter includes a second opening exposing the second substrate in the non-display area.

9. The display device of claim 8, further comprising:
a second color filter disposed between the first color filter and the refractive layer, and exposing the second substrate in an area overlapping the first opening in a plan view and an area overlapping the second opening in a plan view.

10. The display device of claim 9, wherein the second color filter exposes the first color filter in an area adjacent to the first opening and an area adjacent to the second opening.

11. The display device of claim 9, further comprising:
a third color filter disposed between the second color filter and the refractive layer, and exposing the second substrate in an area overlapping the first opening in a plan view and an area overlapping the second opening in a plan view.

12. The display device of claim 11, wherein the third color filter exposes the second color filter in an area adjacent to the first opening and an area adjacent to the second opening.

13. The display device of claim 8, further comprising:
a first light blocking member disposed on the refractive layer and filling the first opening; and
a second light blocking member disposed on the refractive layer and filling the second opening.

14. The display device of claim 1, further comprising:
a driving element disposed on the first substrate between the first substrate and the refractive layer; and
a light emitting element disposed on the driving element between the driving element and the refractive layer.

15. A method of manufacturing a display device, the method comprising:

forming a driving element and a light emitting element on a first substrate, the first substrate including a first display area and a first non-display area adjacent to the first display area;

forming color filters on a second substrate including a second display area corresponding to the first display area, a second non-display area corresponding to the first non-display area and adjacent to the second display area, and a cutting area extending from the second non-display area;

forming a first opening in the color filters in the second non-display area;

forming a second opening in the color filters to expose the second substrate in the cutting area such that the second opening is spaced apart from the first opening;

forming a refractive layer on the color filters to fill the first opening;

attaching the second substrate to the first substrate such that the refractive layer faces the driving element and the light emitting element; and cutting an outer side of the first opening.

16. The method of claim 15, further comprising:

forming a light blocking member on the refractive layer to fill the first opening, before the cutting of the portion between the first opening and the second opening.

17. The method of claim 15, wherein the forming of the refractive layer on the color filters to fill the first opening and the second opening includes:

applying a refractive material for forming the refractive layer onto the color filters that are adjacent to the first opening;

applying the refractive material for forming the refractive layer onto the color filters that are adjacent to the second opening; and allowing the refractive material applied onto the color filters to flow into the first opening and the second opening by steps formed by the first opening and the second opening.

18. The method of claim 17, wherein a thickness of the refractive layer in the second non-display area decreases farther from the second display area in an area in which the color filters and the refractive layer overlap each other in a plan view.

19. The method of claim 15, wherein the color filters form a step in an area adjacent to the first opening.

20. The method of claim 15, wherein the color filters form a step in an area adjacent to the second opening.

21. The method of claim 15, further comprising:

forming a sealing member on the refractive layer formed between the first opening and the second opening, before the cutting of the portion between the first opening and the second opening.

22. The method of claim 15, further comprising:

forming a second opening in the color filters to expose the second substrate in the cutting area such that the second opening is spaced apart from the first opening after the forming the first opening in the color filters in the second non-display area, wherein in the forming a refractive layer on the color filters, the refractive layer fills the second opening, and wherein in the cutting the outer side of the first opening, a portion between the first opening and the second opening is cut.

* * * * *